(12) United States Patent
Anderson et al.

(10) Patent No.: US 7,473,593 B2
(45) Date of Patent: Jan. 6, 2009

(54) SEMICONDUCTOR TRANSISTORS WITH EXPANDED TOP PORTIONS OF GATES

(75) Inventors: Brent Alan Anderson, Jericho, VT (US); Victor W. C. Chan, Newburgh, NY (US); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/275,514

(22) Filed: Jan. 11, 2006

(65) Prior Publication Data
US 2006/0108649 A1 May 25, 2006
US 2007/0158763 A1 Jul. 12, 2007

(51) Int. Cl.
*H01L 21/336* (2006.01)
(52) U.S. Cl. .......... 438/197; 438/301; 438/299
(58) Field of Classification Search ............ 438/197, 438/299, 301
See application file for complete search history.

(56) References Cited

U.S. PATENT DOCUMENTS

2004/0043549 A1* 3/2004 Sayama et al. ............ 438/197
2004/0142524 A1 7/2004 Grupp et al.
2004/0222498 A1 11/2004 Beintner et al.
2005/0059214 A1 3/2005 Cheng et al.
2005/0067659 A1* 3/2005 Gutsche et al. ............ 257/390
2005/0282325 A1* 12/2005 Belyansky et al. ......... 438/199

FOREIGN PATENT DOCUMENTS

JP 53145485 A 12/1978
WO WO2004059727 A1 7/2004

OTHER PUBLICATIONS

Leonard Rubin, John Poate, Ion Implantation in Silicon Technology, Jun./Jul. 2003, American Institute of Physics, pp. 12-15.*

* cited by examiner

*Primary Examiner*—Fernando L. Toledo
*Assistant Examiner*—Jae Lee
(74) *Attorney, Agent, or Firm*—Schmeiser, Olsen & Watts; William D. Sabo

(57) ABSTRACT

A method for forming a semiconductor transistor with an expanded top portion of a gate The gate is expanded through implanting atoms in the top portion of transistor's gate electrode region. The transistor formed includes a semiconductor region having two source/drain regions and a gate dielectric region formed on the channel region between the source/drain regions. The gate electrode region is formed on the gate dielectric region. The gate electrode region is formed such that it is electrically insulated from the channel region by the gate dielectric region. The top of the gate electrode region formed is wider than the bottom of the gate electrode region.

16 Claims, 23 Drawing Sheets

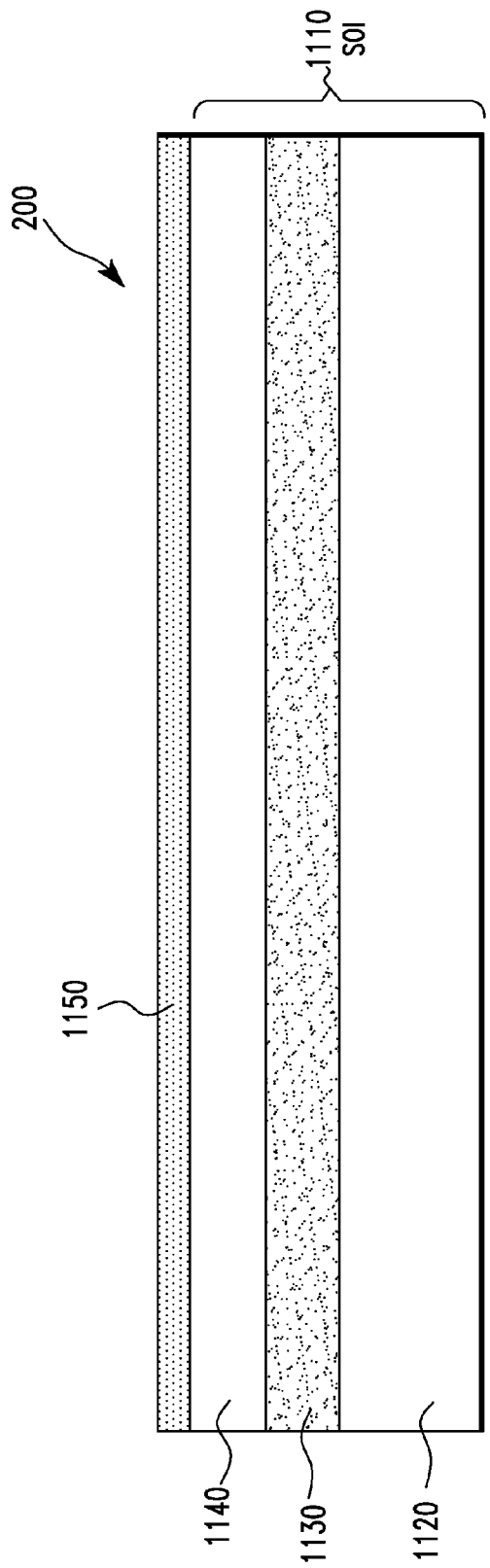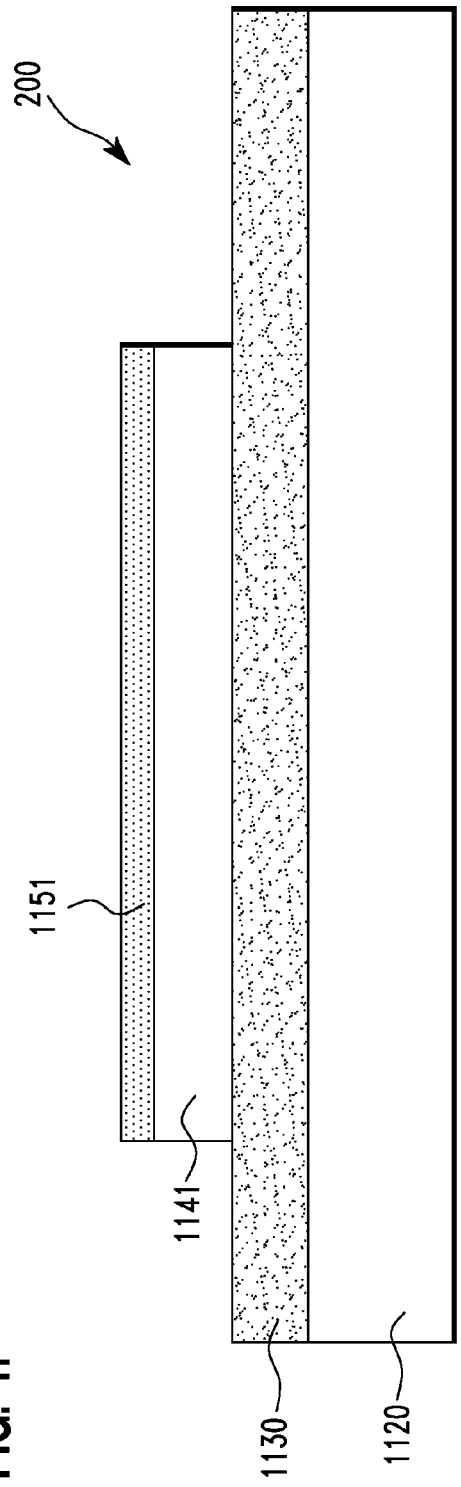

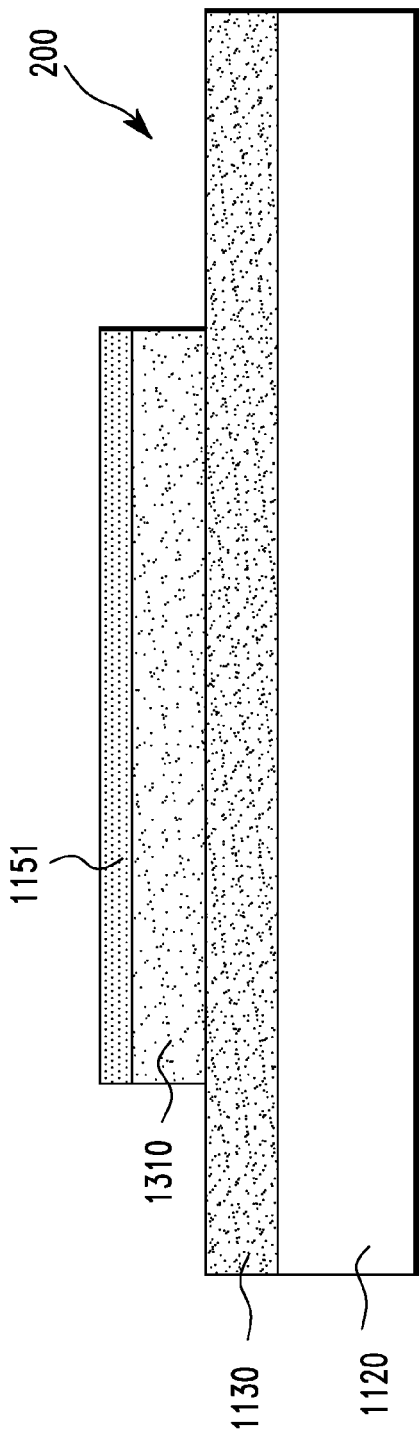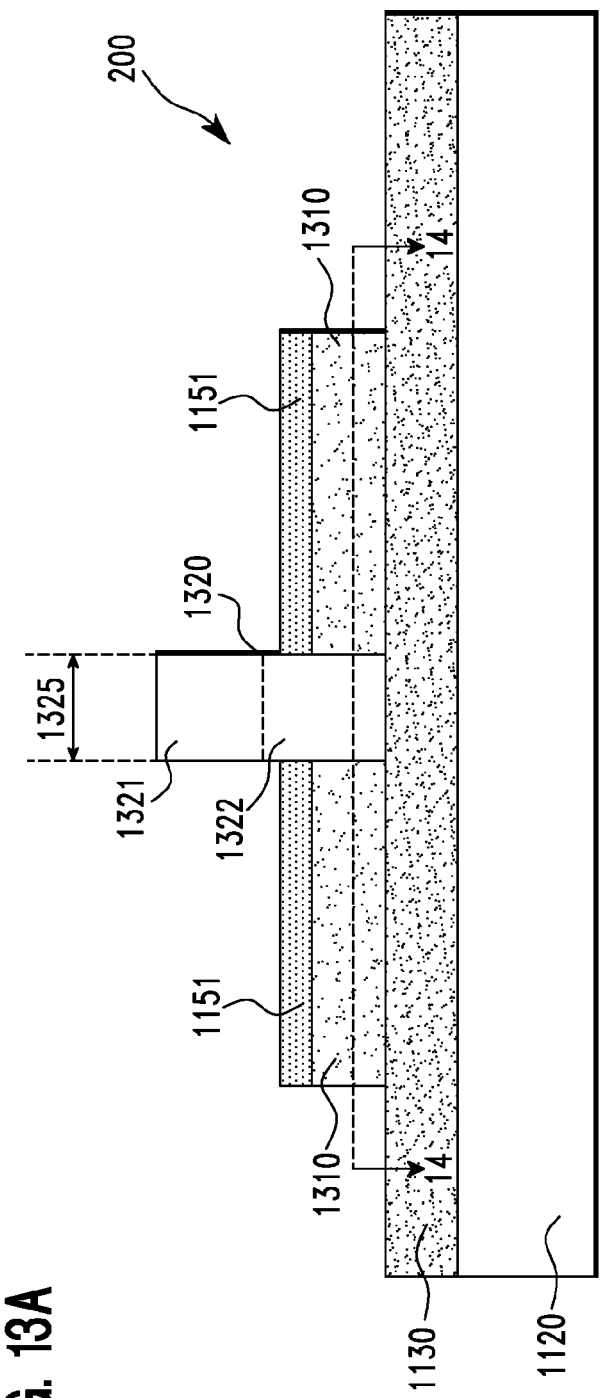

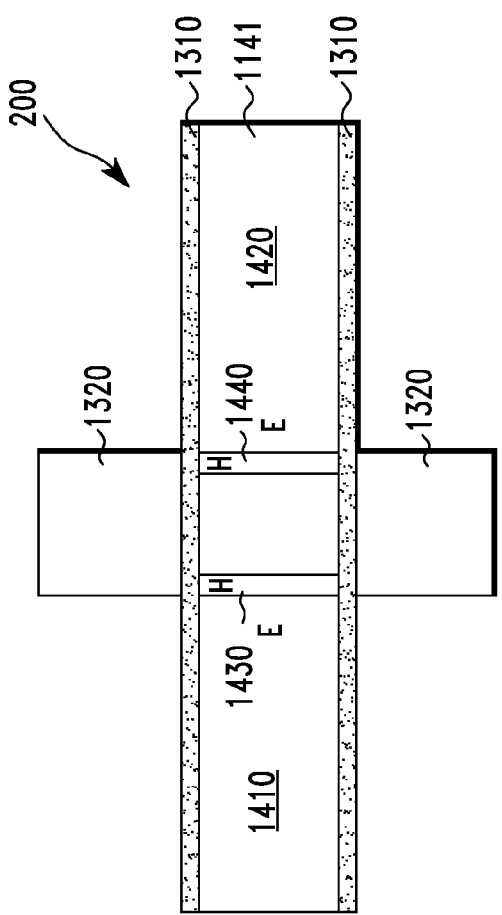
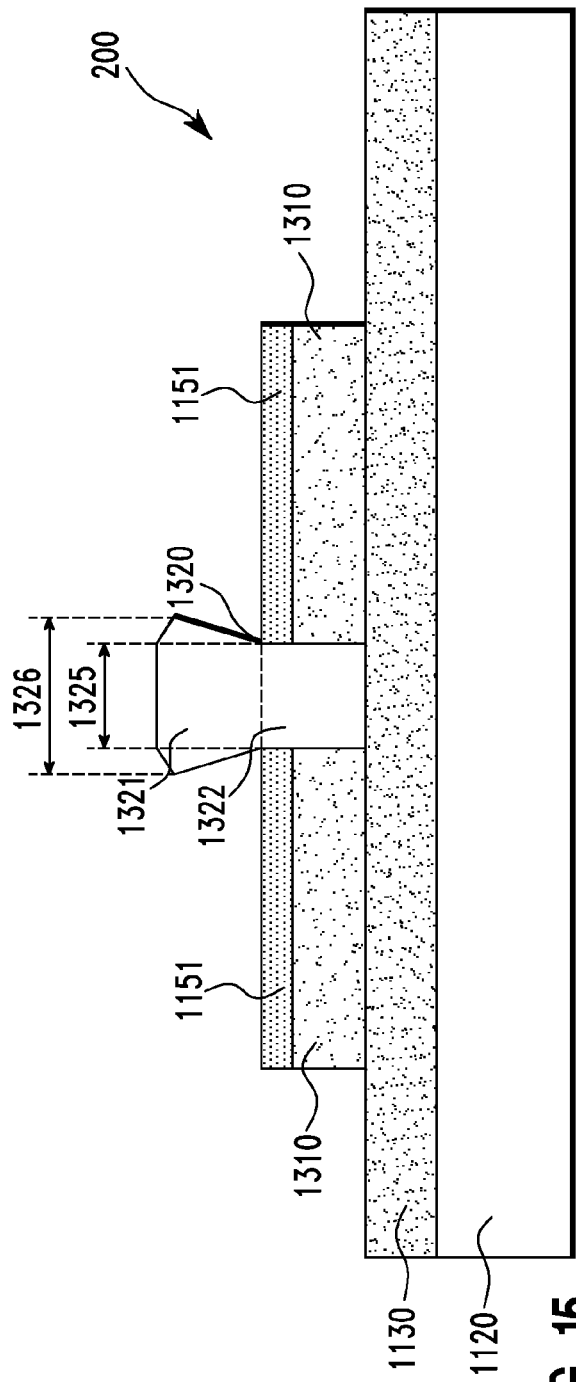
FIG. 14
FIG. 15

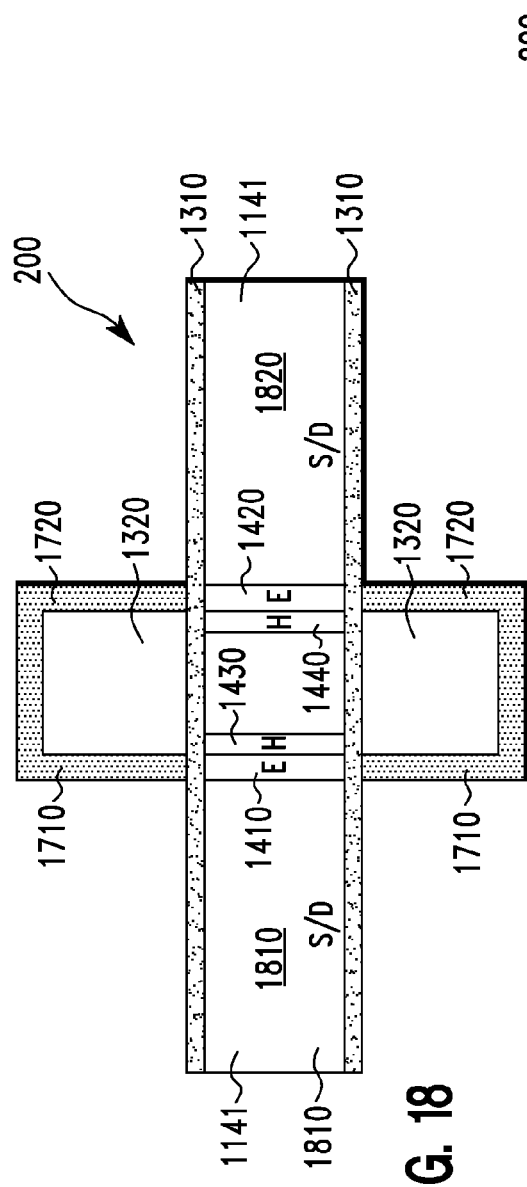
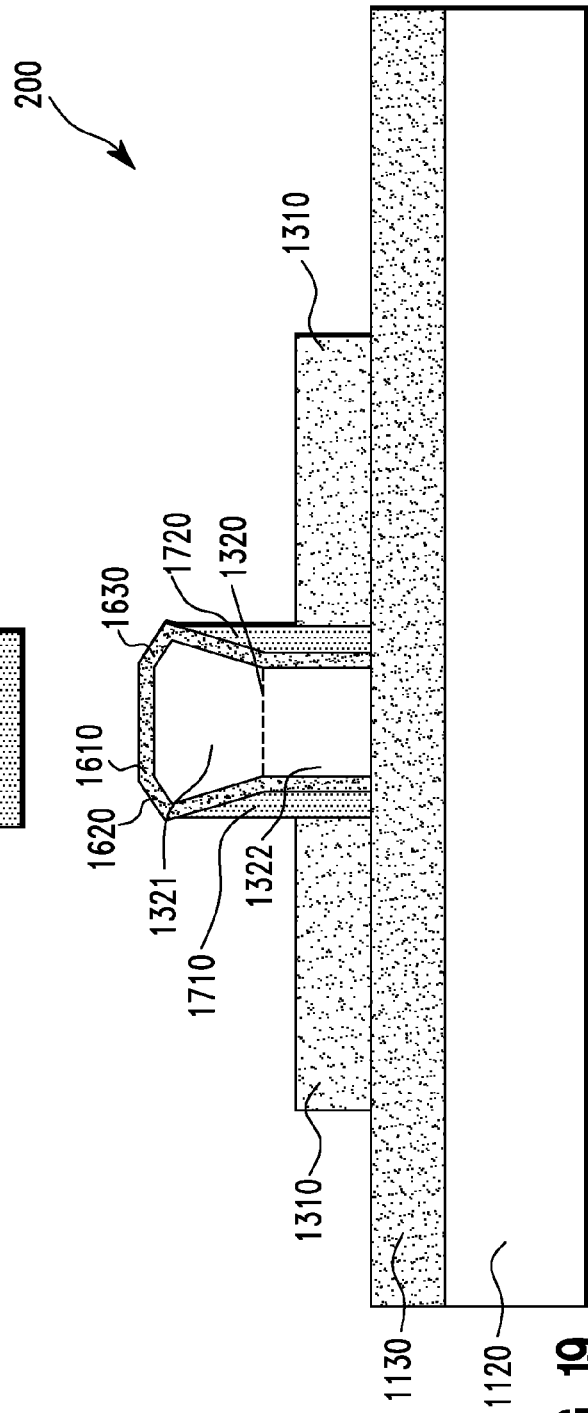
FIG. 18
FIG. 19

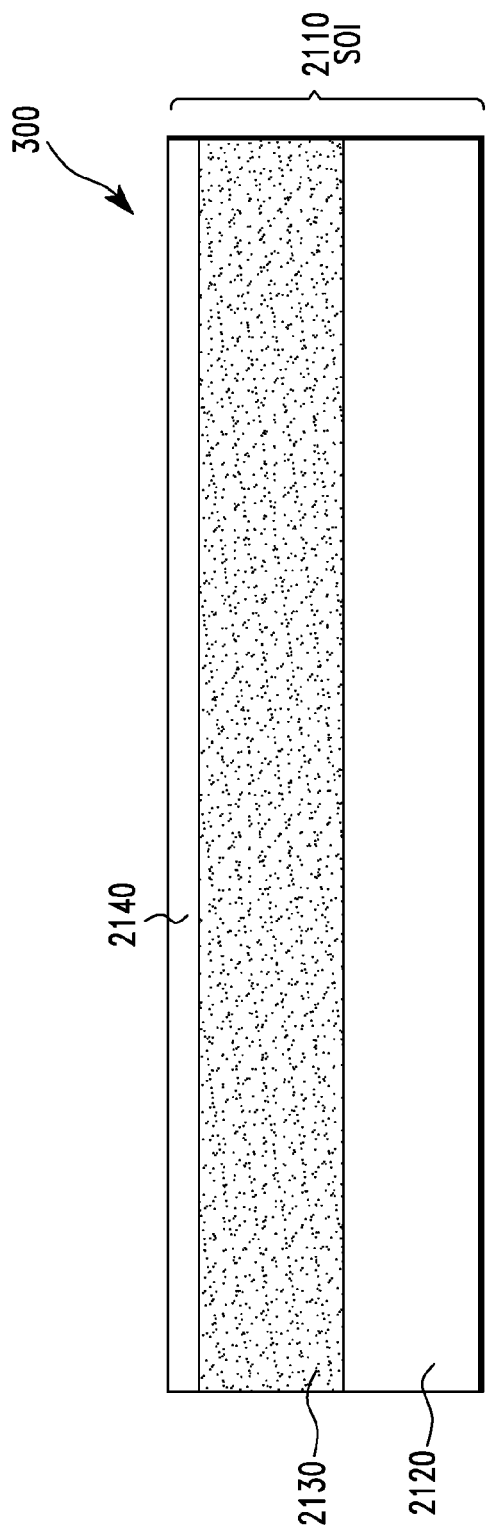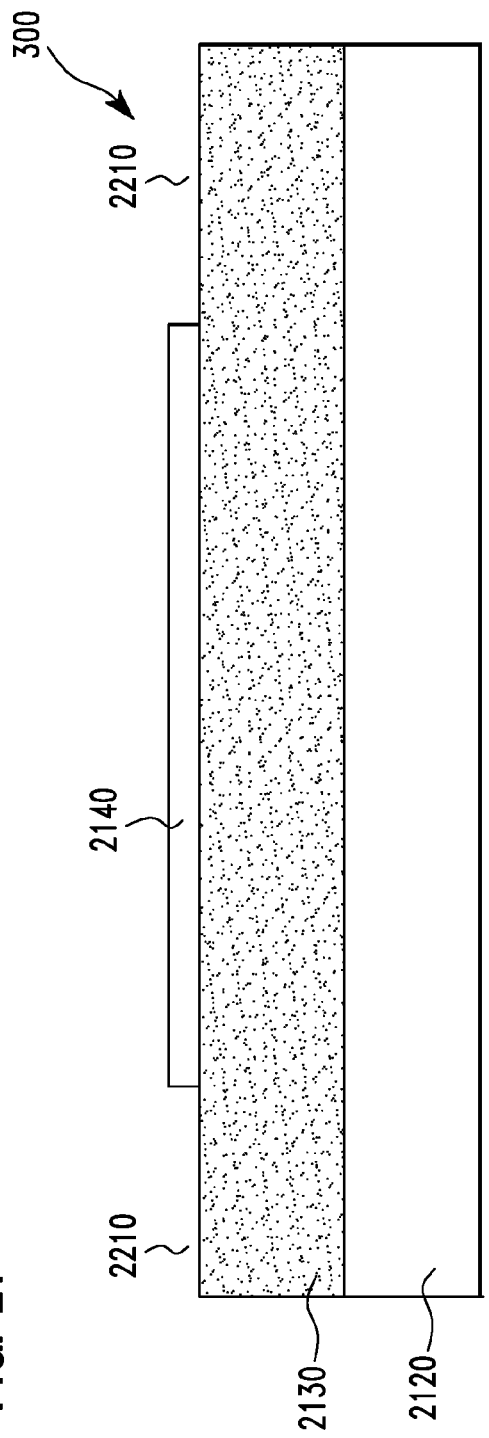

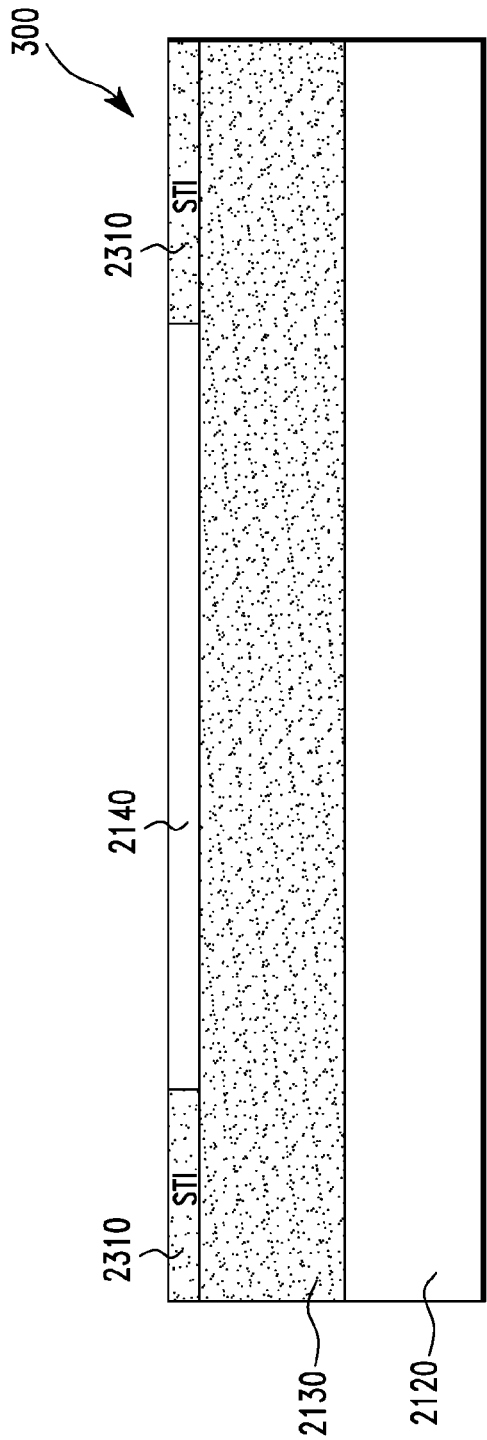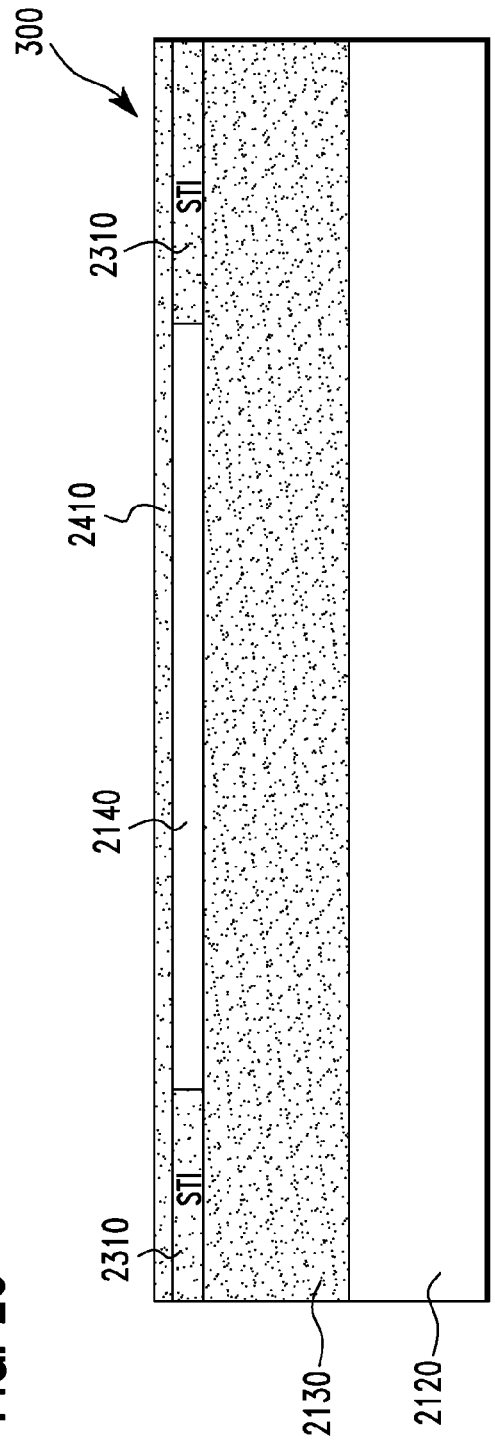

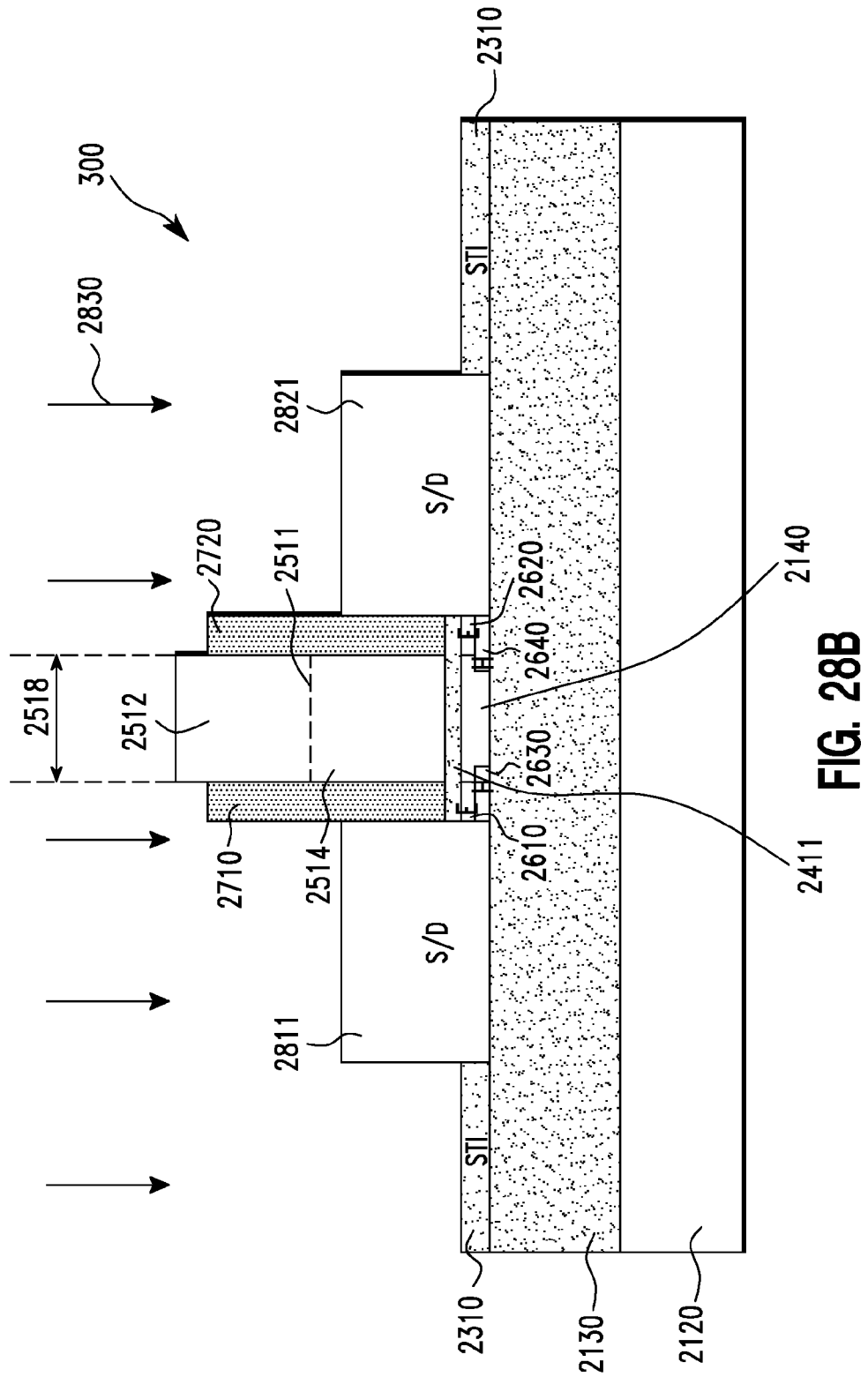

SEMICONDUCTOR TRANSISTORS WITH EXPANDED TOP PORTIONS OF GATES

BACKGROUND OF THE INVENTION

1. Technical Field

The present invention relates to semiconductor transistors, and more particularly, to semiconductor transistors with expanded top portions of gates.

2. Related Art

In the fabrication process of a typical semiconductor device, if a gate is small it is very difficult to form silicide in the top portion of the gate. Therefore, there is a need for a semiconductor transistor with an expanded top portion of a gate (and a method for forming the same).

SUMMARY OF THE INVENTION

The present invention provides a semiconductor structure fabrication method, comprising providing a structure which comprises (a) a semiconductor region including a channel region, a first source/drain region, and a second source/drain region, wherein the channel region is disposed between the first source/drain region and the second source/drain region, (b) a gate dielectric region in direct physical contact with the channel region, and (c) a gate electrode region including a top portion and a bottom portion, wherein the bottom portion is disposed between the top portion and the gate dielectric region, wherein the bottom portion is in direct physical contact with the gate dielectric region, and wherein the gate electrode region is electrically insulated from the channel region by the gate dielectric region; and implanting atoms in the top portion of the gate electrode region so as to expand the top portion of the gate electrode region laterally.

The present invention provides a semiconductor structure fabrication method, comprising providing a structure which comprises (a) a semiconductor region including a first portion, a second portion, and a channel region, wherein the channel region is disposed between the first and second portions, (b) a gate dielectric region in direct physical contact with the channel region, and (c) a gate electrode region including a top portion and a bottom portion, wherein the bottom portion is in direct physical contact with the gate dielectric region, and wherein the gate electrode region is electrically insulated from the channel region by the gate dielectric region; and implanting atoms in the top portion of the gate electrode region so as to expand the top portion of the gate electrode region laterally to form overhangs.

The present invention provides a method of forming a semiconductor transistor with an expanded top portion of a gate or an expanded top portion of a source or drain.

BRIEF DESCRIPTION OF THE DRAWINGS

FIGS. 11-20 show a second fabrication process of a vertical semiconductor transistor with an expanded top portion of a gate, in accordance with embodiments of the present invention.

FIGS. 21-30 show a third fabrication of another semiconductor transistor with an expanded top portion of a gate, in accordance with embodiments of the present invention.

DETAILED DESCRIPTION OF THE INVENTION

FIGS. 1-10 show a first fabrication process for forming a transistor structure 100, in accordance with embodiments of the present invention, wherein FIGS. 1-10 show cross-section views of the transistor structure 100.

Figure 1:
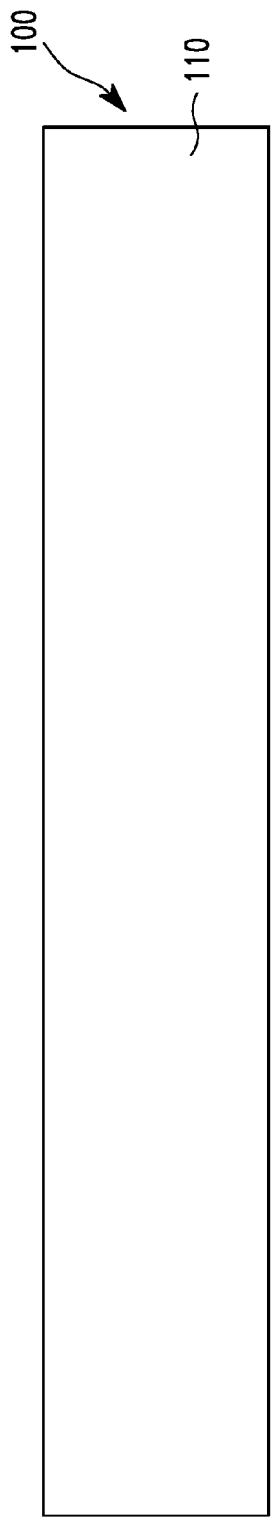
FIGS. 1-10 show a first fabrication process of a semiconductor transistor with an expanded top portion of a gate, in accordance with embodiments of the present invention.

More specifically, with reference to FIG. 1, in one embodiment, the first fabrication process starts out with a silicon substrate 110.

Figure 2:
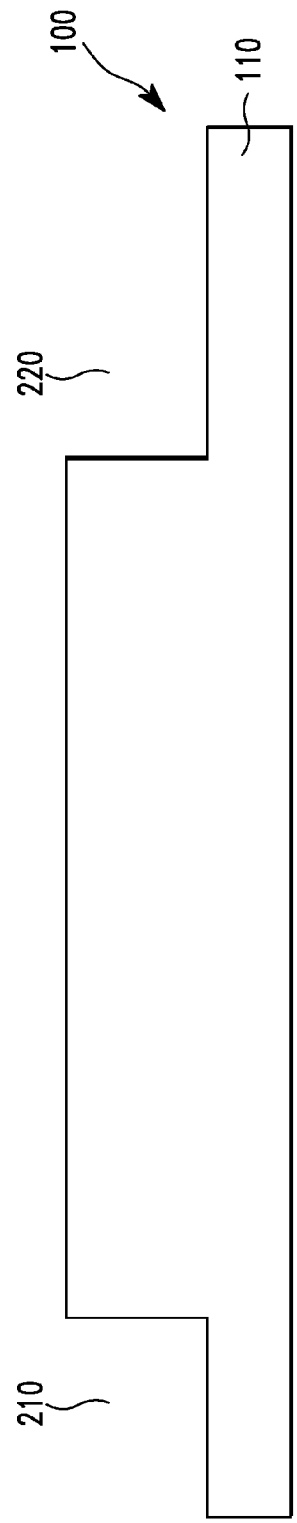

Next, with reference to FIG. 2, in one embodiment, two trenches 210 and 220 are formed in the silicon substrate 110. Illustratively, the trenches 210 and 220 are formed using a conventional lithographic and etching process.

Figure 3:
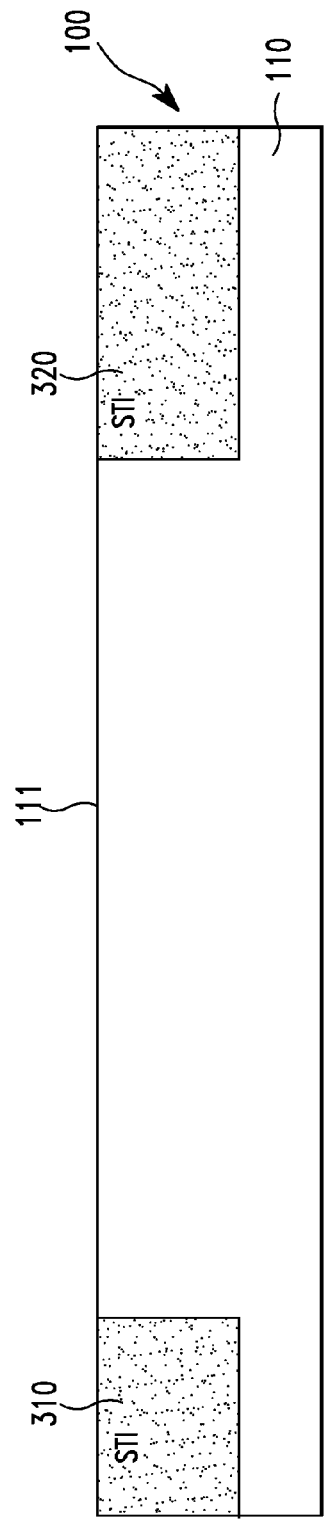

Next, with reference to FIG. 3, in one embodiment, two STI (Shallow Trench Isolation) regions 310 and 320 are formed in the two trenches 210 and 220 (FIG. 2), respectively, using a conventional method. Illustratively, the two STI regions 310 and 320 comprise silicon dioxide.

Figure 4:
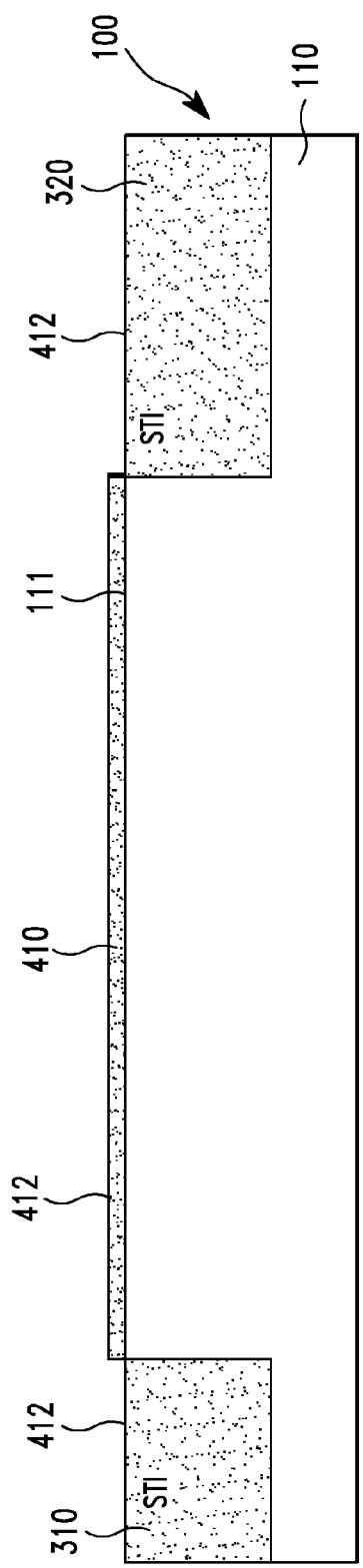

Next, with reference to FIG. 4, in one embodiment, a gate dielectric layer 410 is formed on a top surface 111 of the silicon substrate 110. Illustratively, the gate dielectric layer 410 comprises silicon dioxide. In one embodiment, the gate dielectric layer 410 is formed by thermal oxidation.

Figure 5:
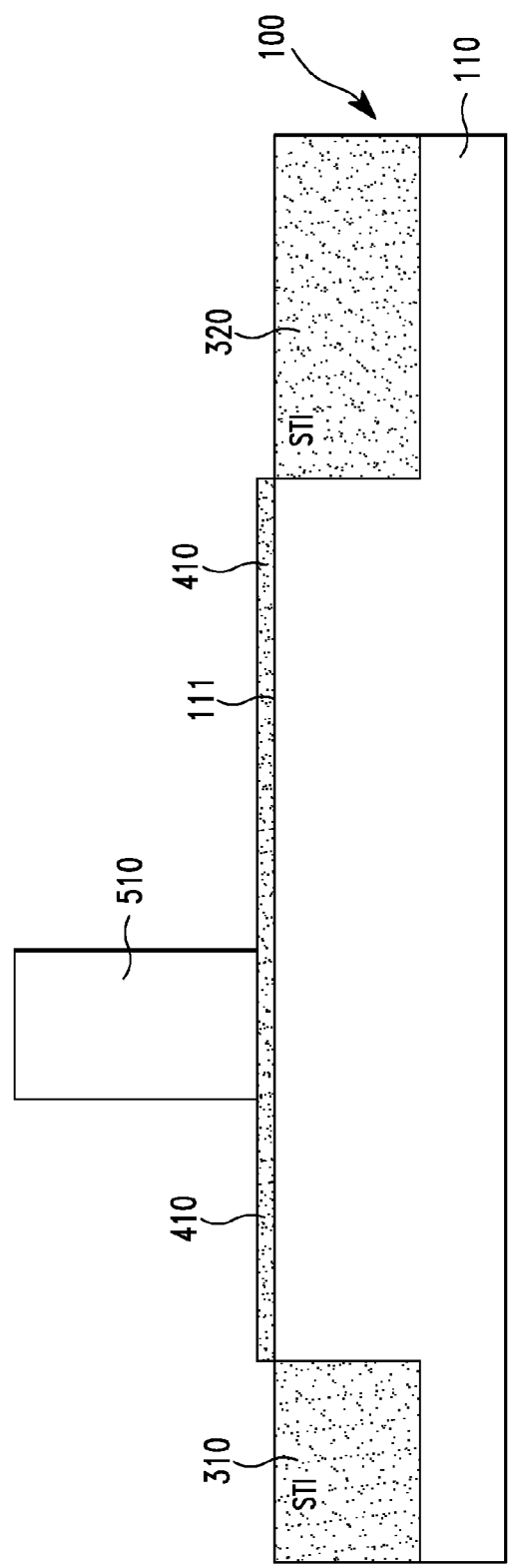

Next, with reference to FIG. 5, in one embodiment, a gate electrode region 510 is formed on the top surface 111 of the silicon substrate 110. In one embodiment, the gate electrode region 510 is formed by (i) CVD (Chemical Vapor Deposition) of polysilicon everywhere on a top surface 412 of the structure 100 (FIG. 4) to form a polysilicon layer (not shown), and then (ii) a conventional lithographic and etching process to etch the deposited polysilicon layer, resulting in the gate electrode region 510, as shown in FIG. 5.

Figure 6:
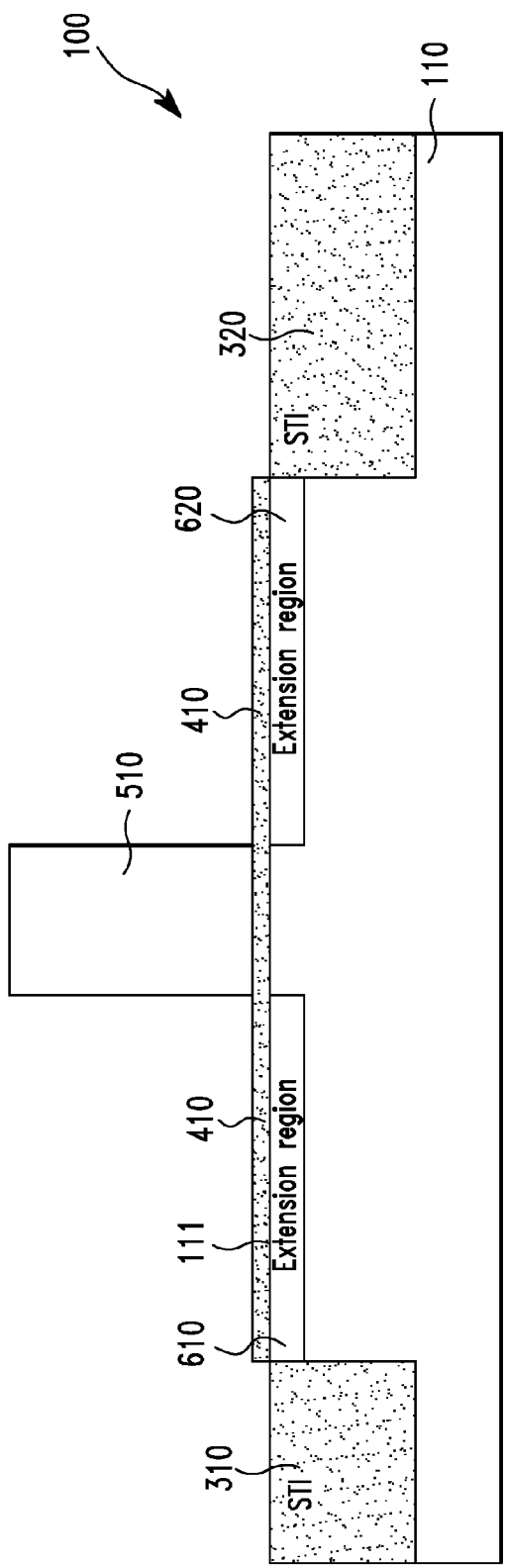

Next, with reference to FIG. 6, in one embodiment, extension regions 610 and 620 are formed in the silicon substrate 110. Illustratively, the extension regions 610 and 620 are formed by ion implantation using the gate electrode region 510 as a blocking mask.

Figure 7:
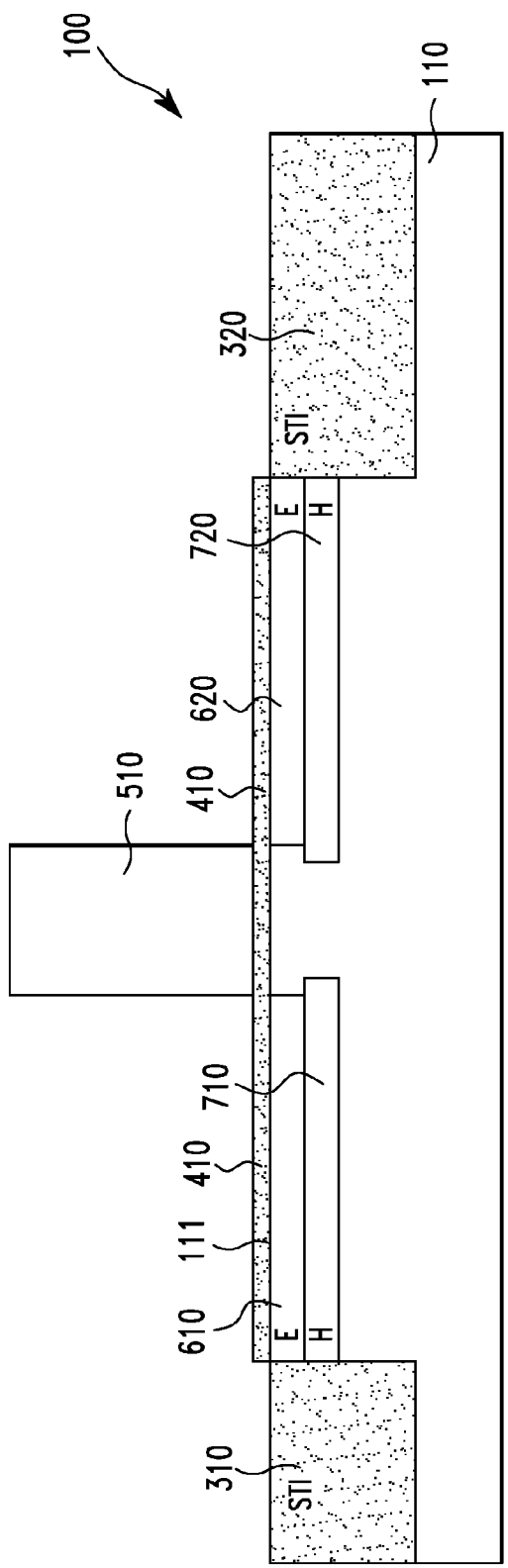

Next, with reference to FIG. 7, in one embodiment, halo regions 710 and 720 are formed in the silicon substrate 110. Illustratively, the halo regions 710 and 720 are formed by ion implantation using the gate electrode region 510 as a blocking mask.

Figure 8:
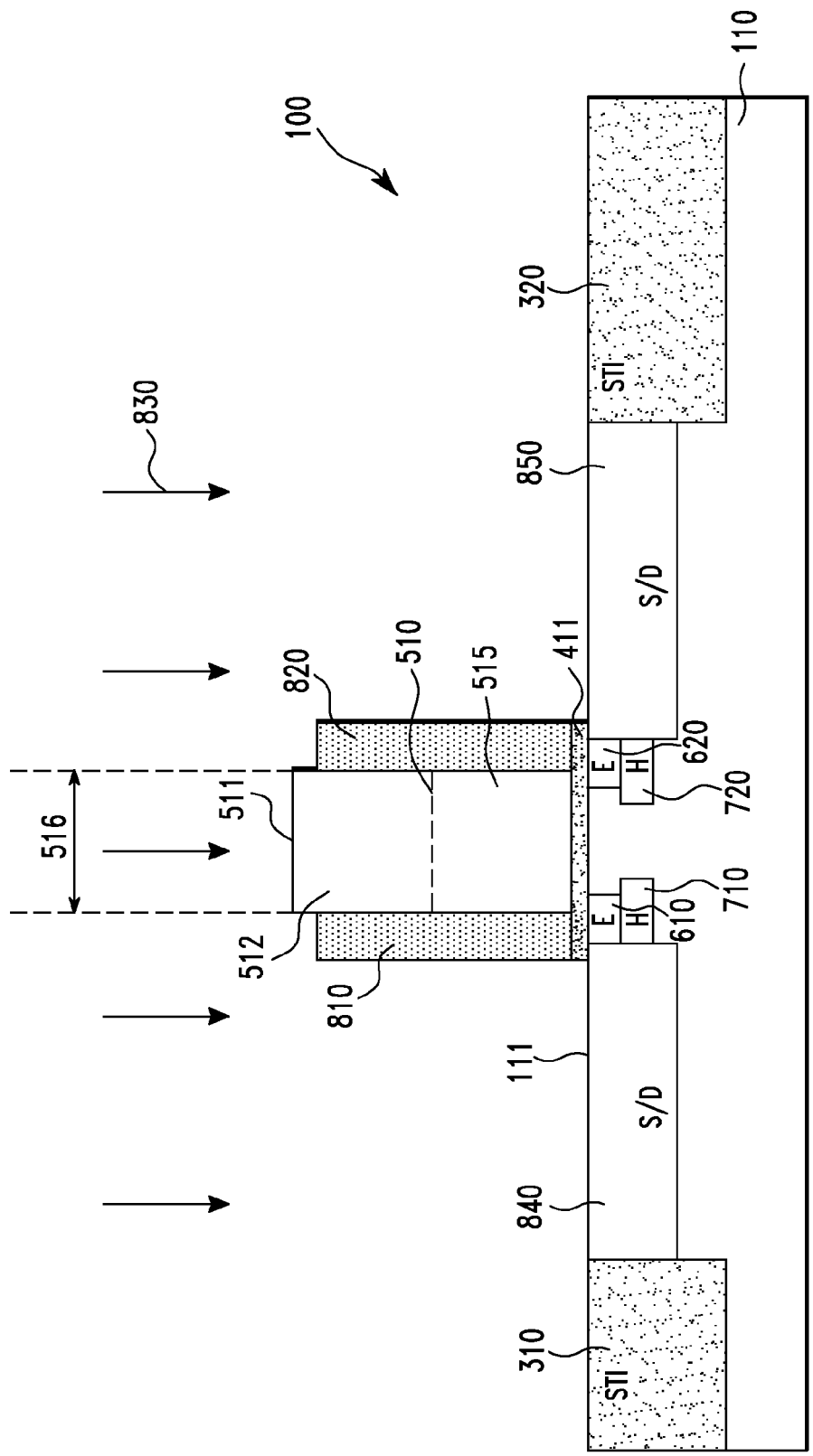

Next, with reference to FIG. 8, in one embodiment, dielectric spacers 810 and 820 are formed on side walls of the gate electrode region 510. Illustratively, the dielectric spacers 810 and 820 are formed by (i) CVD of an insulating material, such as silicon dioxide or silicon nitride, or a composite, everywhere on top of the structure 100 of FIG. 7, and then (ii) directional etching back until the top surface 111 of the silicon substrate 110 and a top surface 511 of the gate electrode region 510 are exposed to the surrounding ambient.

Next, in one embodiment, source/drain regions 840 and 850 are formed in the silicon substrate 110. Illustratively, the source/drain regions 840 and 850 are formed by ion implantation using the gate electrode region 510 and the dielectric spacers 810 and 820 as a blocking mask.

Next, in one embodiment, germanium atoms are implanted in a top portion 512 of the gate electrode region 510 by ion implantation in a direction indicated by arrows 830. Hereafter, the implantation of germanium atoms in the top portion 512 of the gate electrode region 510 of FIG. 8 can be referred to as a germanium implantation step 830. Illustratively, the germanium implantation step 830 uses germanium atoms at a high dose ($10^{16}$ Ge atoms/cm$^2$) and at a low energy. The directions 830 can be vertical or tilted less than 10 degrees from vertical. As a result of the germanium implantation step 830, the top portion 512 expands laterally, as shown in FIG. 9A.

Figure 9A:
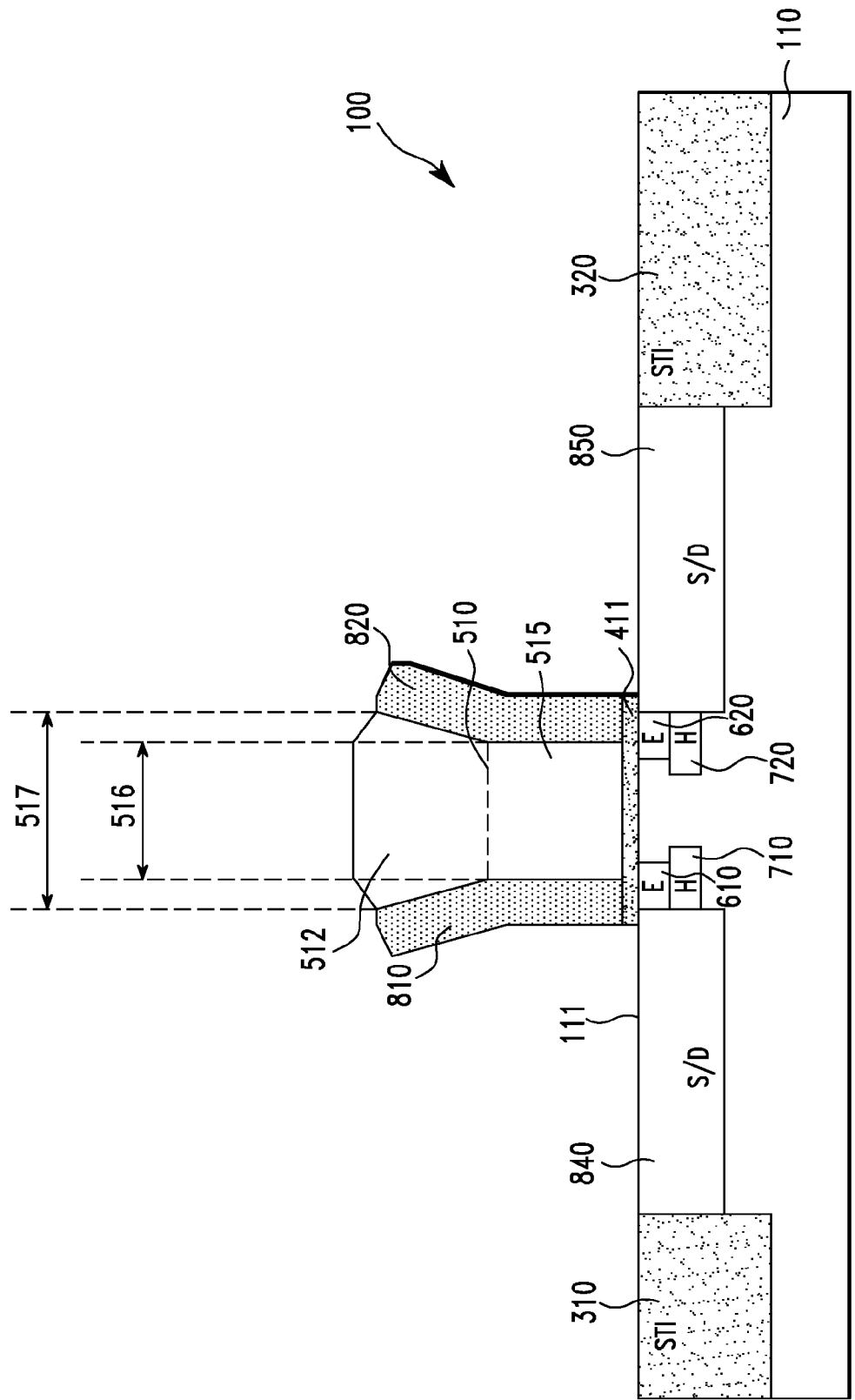

With reference to FIG. 9A, it can be seen that as a result of the lateral expansion of the top portion 512, a width 517 of the top portion 512 is greater than a width 516 of the bottom portion 515. In one embodiment, the top portion 512 of the gate electrode region 510 is expanded laterally at least 20%. In other words, the width 517 is at least 120% of the width 516.

Figure 9B:
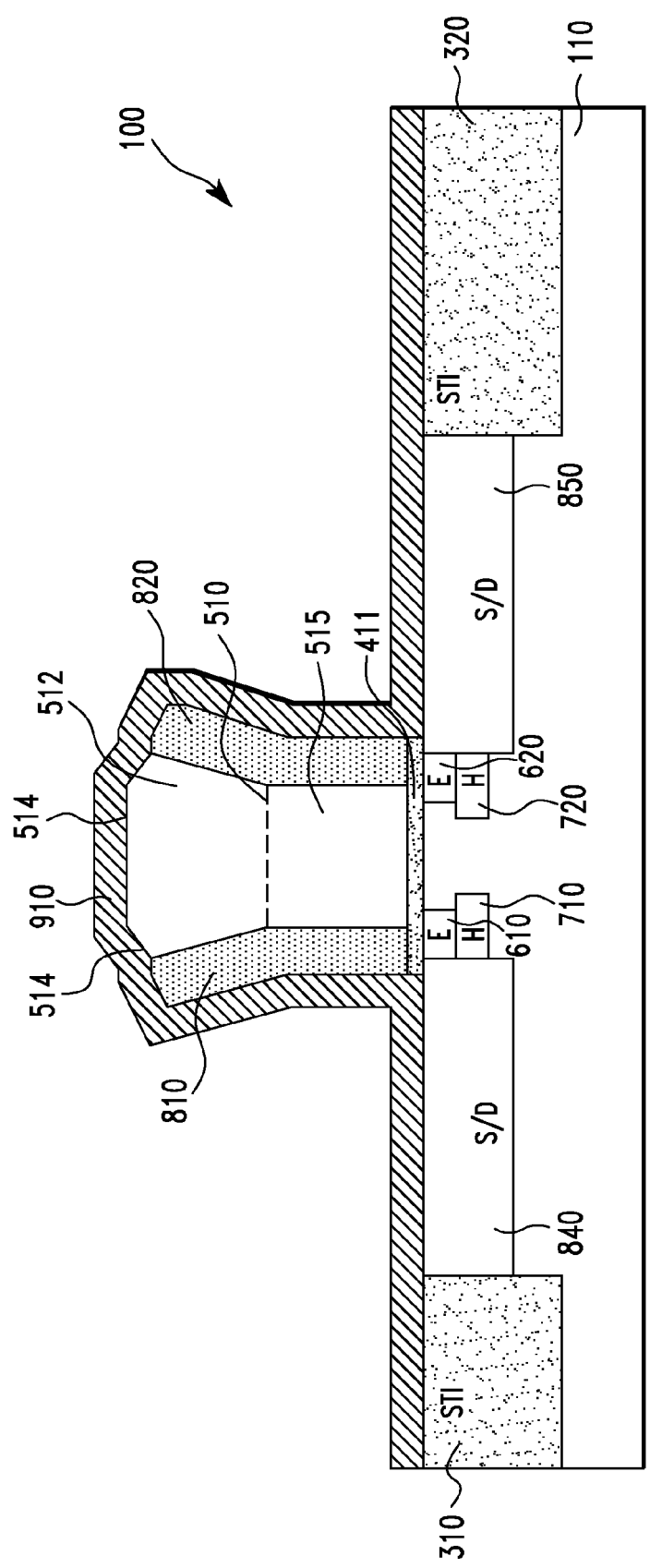

Next, with reference to FIG. 9B, in one embodiment, a metal (e.g., nickel, etc.) layer 910 is formed on top of the structure 100 of FIG. 9A. Illustratively, the nickel layer 910 is formed by sputtering of nickel everywhere on top of the structure 100 of FIG. 9A.

Figure 10:
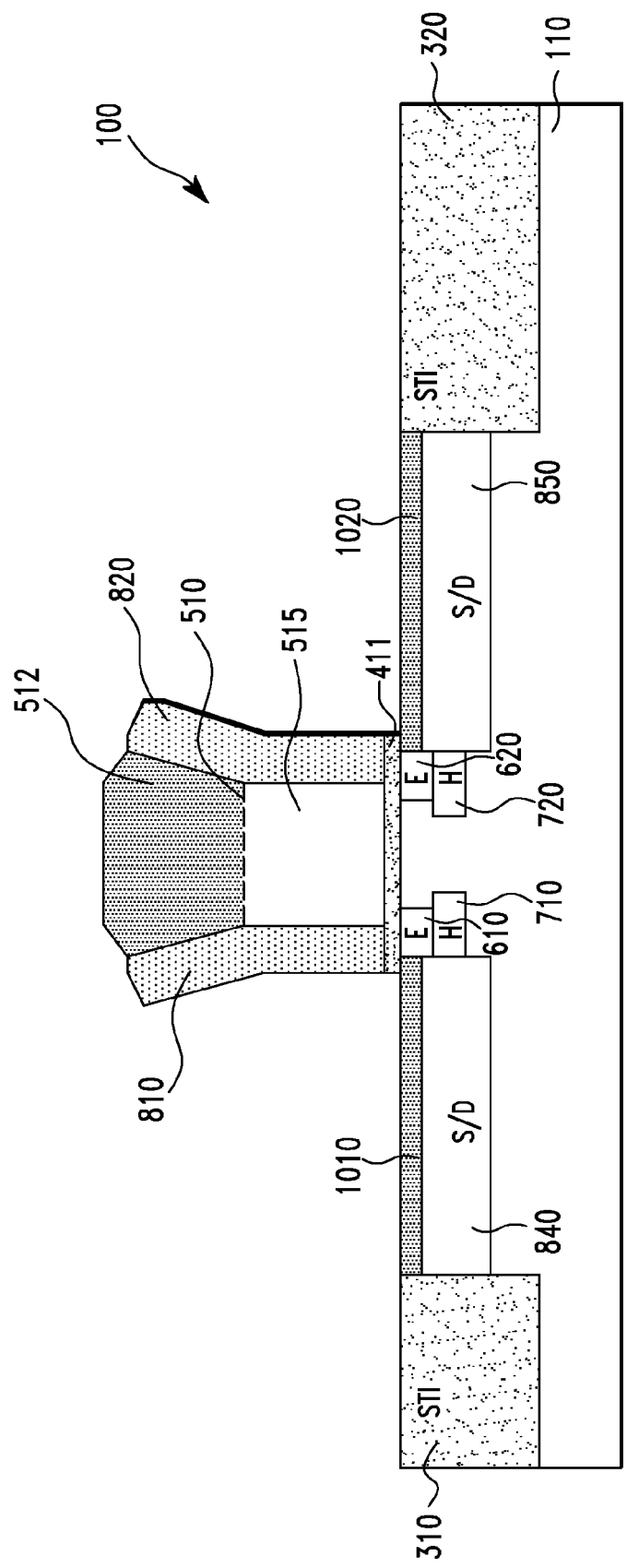

Next, with reference to FIG. 10, in one embodiment, silicide regions 512, 1010, and 1020 are formed on top of the gate electrode region 510, the source/drain regions 840 and 850, respectively. Illustratively, the silicide regions 512, 1010 and 1020 comprise nickel silicide. In one embodiment, the silicide regions 512, 1010 and 1020 are formed by first annealing the whole structure 100 of FIG. 9B so that nickel of the nickel layer 910 chemically reacts with silicon of the gate electrode region 510, the source/drain regions 840 and 850, resulting in the silicide regions 512, 1010 and 1020. Then, in one embodiment, unreacted nickel is removed by a wet etching step, resulting in structure 100 of FIG. 10. In one embodiment, the entire top portion 512 (FIG. 9B) of the gate electrode region 510 chemically reacts with Ni of the Ni layer 910 resulting in the silicide region 512 as shown in FIG. 10.

As can be seen in FIGS. 8, 9B, and 10, because of the germanium implantation step 830 (FIG. 8), an interfacing surface 514 between the nickel layer 910 and the top portion 512 of the gate electrode region 510 (FIG. 9B) is larger than the case in which the implantation step 830 is not performed. Therefore, it is easier for nickel (of the nickel layer 910) to react with silicon of the top portion 512 (FIG. 9B) than in the case the top portion of the gate electrode region 510 is not expanded. Also as a result of the top portion 512 being expanded laterally, the silicide region 512 (FIG. 10) is more conductive than the case in which the top portion 512 of the gate electrode 510 is not expanded.

FIGS. 11-20 show a second fabrication process for forming a transistor structure 200, in accordance with embodiments of the present invention.

More specifically, with reference to FIG. 11, in one embodiment, the second fabrication process starts out with an SOI (Silicon on Insulator) substrate 1110. Illustratively, the SOI substrate 1110 comprises a silicon layer 1120, a buried oxide layer 1130 on the silicon layer 1120, and a silicon layer 1140 on the buried oxide layer 1130. Illustratively, the SOI substrate 1110 is formed by a conventional method. In one embodiment, the SOI substrate 1110 may comprise an Ultra-Thin SOI wherein the silicon layer 1140 is less than 15 nm in thickness.

Next, in one embodiment, a dielectric hard mask layer 1150 is formed on top of the silicon layer 1140. Illustratively, the dielectric hard mask layer 1150 is formed by CVD of silicon nitride or silicon dioxide, or a composite of the two, everywhere on top of the silicon layer 1140.

Next, in one embodiment, a lithographic and etching step is performed to etch the dielectric hard mask layer 1150 and then the silicon layer 1140 so as to form a dielectric cap region 1151 and a fin region 1141, respectively, as shown in FIG. 12.

With reference to FIG. 12 (a front view of the structure 200), it should be noted that the dielectric cap region 1151 and the fin region 1141 are farther away from the viewer than the silicon layer 1120 and the buried oxide layer 1130.

Next, with reference to FIG. 13A, in one embodiment, a silicon dioxide layer 1310 is formed on side walls of the fin region 1141 of FIG. 12. Illustratively, the silicon dioxide layer 1310 is formed by thermal oxidation. FIG. 13A shows a front view of the structure 200 after the silicon dioxide layer 1310 is formed. In alternative embodiments, 1310 may comprise a high-k gate dielectric, such as hafnium silicate, deposited, for example, by means of CVD, MOCVD, ALD.

Next, with reference to FIG. 13B, in one embodiment, a gate electrode region 1320 is formed on top of the dielectric cap region 1151 and on side walls of the silicon dioxide layer 1310. Illustratively, the gate electrode region 1320 comprises polysilicon. In one embodiment, the gate electrode region 1320 is formed by (i) CVD of polysilicon everywhere on top of the structure 200 of FIG. 13A, and then (ii) a conventional lithographic and etching process. FIG. 13B shows a front view of the structure 200 after the gate electrode region 1320 is formed. So, it should be noted that the silicon dioxide layer 1310 and the dielectric cap region 1151 are farther away from the viewer than the gate electrode region 1320.

Next, in one embodiment, extension regions 1410 and 1420 and halo regions 1430 and 1440 (not shown in FIG. 13B but can be seen in FIG. 14) are formed in the fin region 1141 of FIG. 12 by ion implantation using the gate electrode region 1320 as a blocking mask.

FIG. 14 shows a top down view of the structure 200 of FIG. 13B along a line 14-14 after the formation of the extension regions 1410 and 1420 and halo regions 1430 and 1440.

Next, in one embodiment, germanium atoms are implanted on a top portion 1321 (FIG. 13B) of the gate electrode region 1320 by ion implantation. Illustratively, germanium atoms are implanted at a high dose ($10^{16}$ Ge atoms/cm$^2$) and at a low energy. As a result of the germanium implantation in the top portion 1321 (FIG. 13B) of the gate electrode 1320, the top portion 1321 expands laterally as shown in FIG. 15.

With reference to FIG. 15, it can be seen that as a result of the lateral expansion of the top portion 1321, a width 1326 of the top portion 1321 is greater than a width 1325 of a bottom portion 1322. In one embodiment, the top portion 1321 of the gate electrode region 1320 is expanded laterally at least 20%. In other words, the width 1326 is at least 120% of the width 1325.

Figure 16:
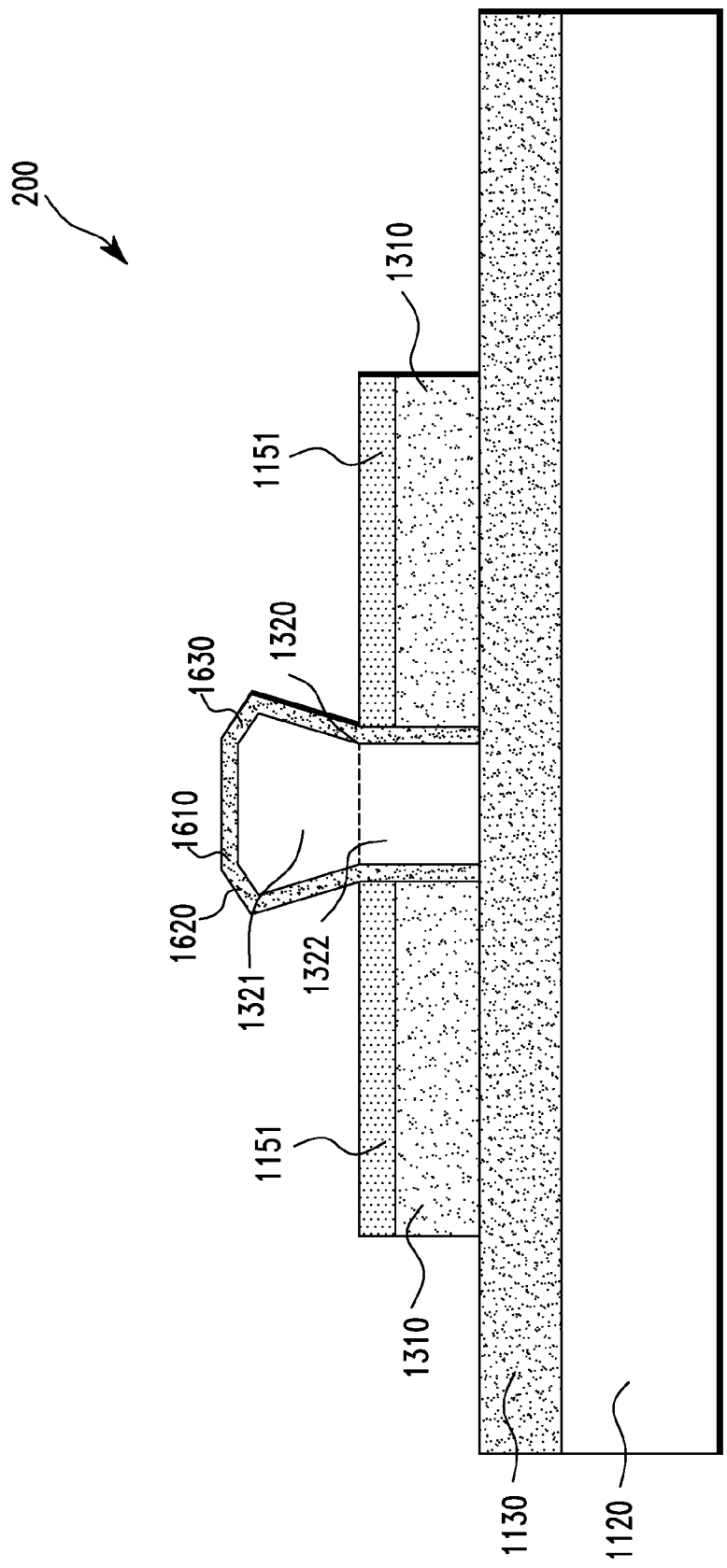

Next, with reference to FIG. 16, in one embodiment, a silicon dioxide layer 1610 is formed on top and side walls of the gate electrode region 1320. Illustratively, the silicon dioxide layer 1610 is formed by thermal oxidation. Hereafter, expanded top portions 1620 and 1630 of the gate electrode region 1320 are referred to as overhangs 1620 and 1630. FIG. 16 shows a front view of the structure 200 after the silicon dioxide layer 1610 is formed (except for the silicon dioxide layer 1610 and the gate electrode region 1320 whose cross section view is shown). It should be noted that, the silicon dioxide layer 1310 and the dielectric cap region 1151 are farther away from the viewer than the silicon dioxide layer 1610 and the gate electrode region 1320.

Figure 17:
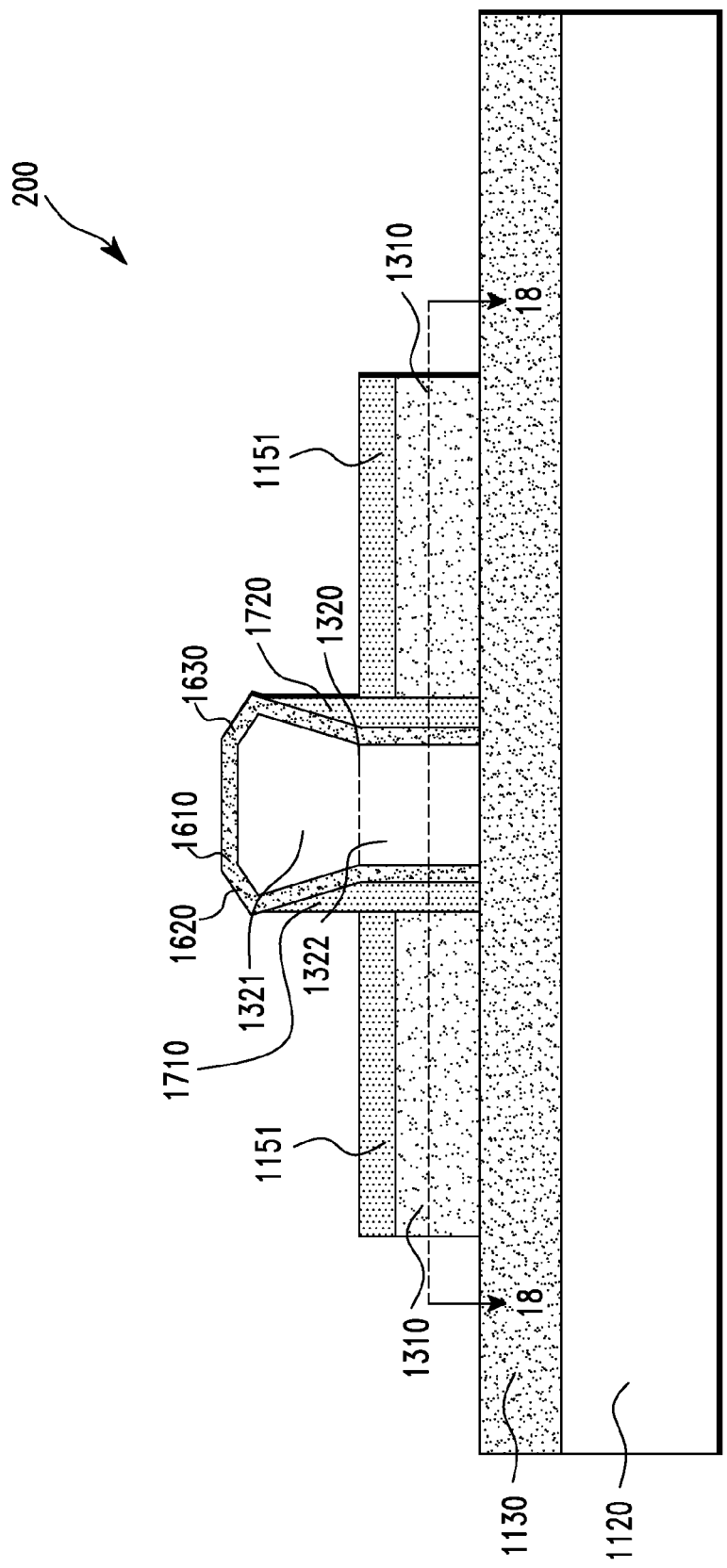

Next, with reference to FIG. 17, in one embodiment, dielectric spacers 1710 and 1720 are formed on side walls of the gate electrode region 1320 and under the overhangs 1620 and 1630. Illustratively, the dielectric spacers 1710 and 1720 are formed by (i) CVD of a dielectric material, such as silicon dioxide, silicon nitride, or a composite of the two, everywhere on top of the structure 200 of FIG. 16 to form a dielectric layer (not shown), and then (ii) directionally etching back the deposited dielectric layer. More specifically, the deposited dielectric layer is over etched so that the dielectric spacers 1710 and 1720 remain on side walls of the gate electrode region 1320 but no dielectric material remains on sidewalls of the silicon dioxide layer 1310. FIG. 17 shows a front view of the structure 200 after the dielectric spacers 1710 and 1720 are formed (except for the silicon dioxide layer 1610, the gate electrode region 1320 and the dielectric spacers 1710 and 1720 whose cross section view is shown).

Next, in one embodiment, source/drain regions 1810 and 1820 (not shown in FIG. 17 but can be seen in FIG. 18) are formed in the fin region 1141 of FIG. 18 by ion implantation using the gate electrode region 1320 and the dielectric spacers 1710 and 1720 as a blocking mask.

FIG. 18 shows a top down view of the structure 200 of FIG. 17 along a line 18-18 after the formation of the source/drain regions 1810 and 1820.

Next, with reference to FIG. 19, in one embodiment, the dielectric cap region 1151 of FIG. 17 is removed by a Reactive Ion Etch (RIE), or a wet etching step, resulting in the structure 200 of FIG. 19.

Figure 20:
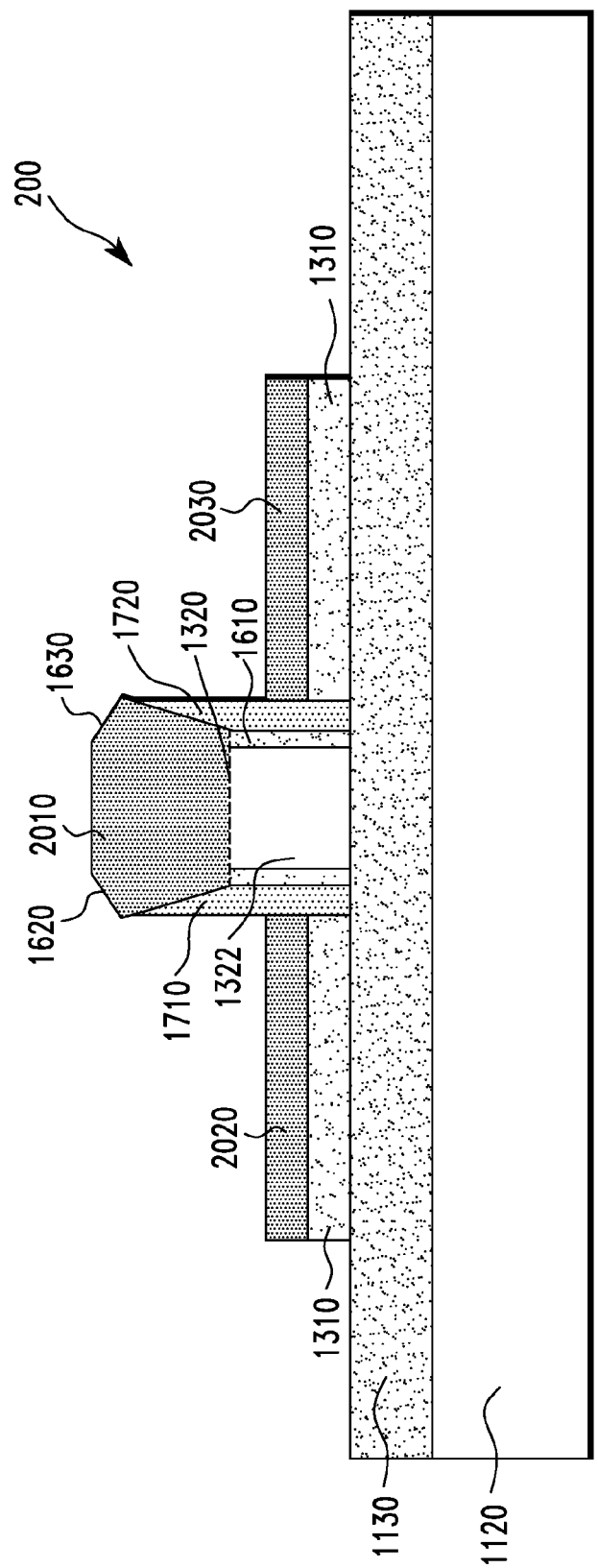

Next, with reference to FIG. 20, in one embodiment, silicide regions 2010, 2020, and 2030 are formed on top of the gate electrode region 1320 and the source/drain regions 1810 and 1820 (FIG. 18). Illustratively, the silicide regions 2010, 2020, and 2030 comprise silicide nickel. In one embodiment, the silicide regions 2010, 2020 and 2030 are formed by (i) sputtering of nickel everywhere on top of the structure 200 (FIG. 19) to form a nickel layer (not shown), then (ii) annealing so that nickel of the deposited nickel layer chemically reacts with silicon of the gate electrode region 1320 and the source/drain regions 1810 and 1820 (FIG. 18) resulting in the silicide regions 2010, 2020, and 2030. Then, unreacted nickel is removed by a wet etching step, resulting in structure 200 of FIG. 20.

Similar to the structure 100 of FIG. 10, the structure 200 of FIG. 20 has an advantage of the enlarged silicide region 2010 which is more conductive than in the case in which the top portion 1321 of the gate electrode 1320 is not expanded laterally by the germanium implantation. Moreover, because the top portion 1321 of the gate electrode 1320 (FIG. 19) is enlarged, it is easier for nickel of the deposited nickel layer (not shown) to chemically react with silicon of the gate electrode region 1320 to form the silicide region 2010.

FIGS. 21-30 show a third fabrication process for forming a transistor structure 300, in accordance with embodiments of the present invention, wherein FIGS. 21-30 show cross-section views of the transistor structure 300.

More specifically, with reference to FIG. 21, in one embodiment, the third fabrication process starts out with an SOI substrate 2110. In one embodiment, the SOI substrate 2110 comprises a silicon layer 2120, a buried oxide layer 2130 on the silicon layer 2120, and a silicon layer 2140 on the buried oxide layer 2130. Illustratively, the SOI substrate 2110 is formed by a conventional method.

Next, with reference to FIG. 22, in one embodiment, a trench 2210 is formed in the silicon layer 2140. In one embodiment, the trench 2210 is formed by a conventional lithographic and etching process.

Next, with reference to FIG. 23, in one embodiment, an STI region 2310 is formed in the trench 2210 (FIG. 22) using a conventional method. Illustratively, the STI region 2310 comprises silicon dioxide.

Next, with reference to FIG. 24, in one embodiment, a gate dielectric layer 2410 is formed on top of the structure 300 (FIG. 23). The gate dielectric layer 2410 may be formed (a) by oxidation and nitridation of a top portion of the silicon layer 2140, to form a silicon oxinitride dielectric, or (b) by deposition of a high-k material such as hafnium silicate by CVD, MOCVD, or ALD.

Figure 25:
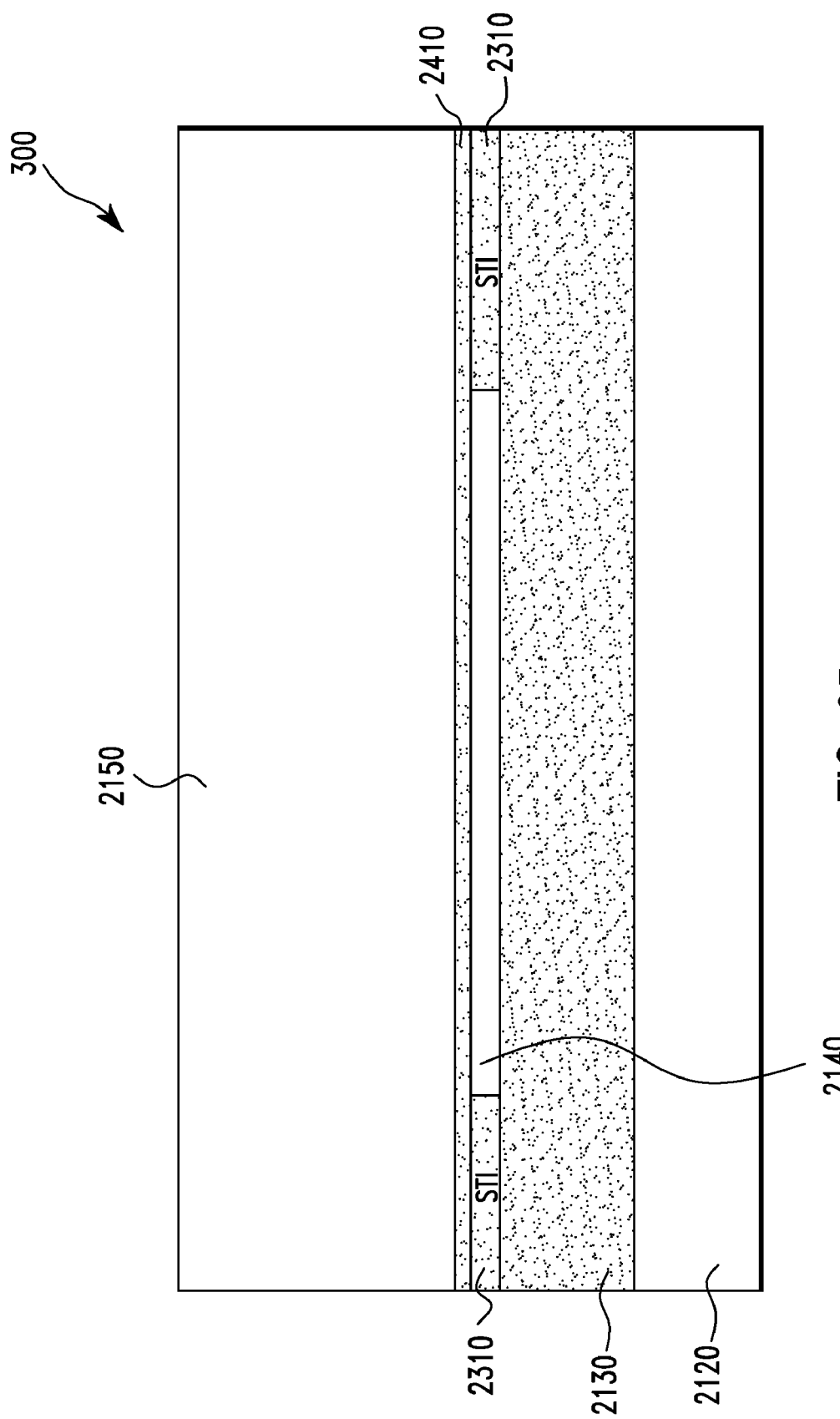

Next, with reference to FIG. 25, in one embodiment, a polysilicon layer 2510 is formed on top of the structure 300 (FIG. 24) by CVD.

Figure 26:
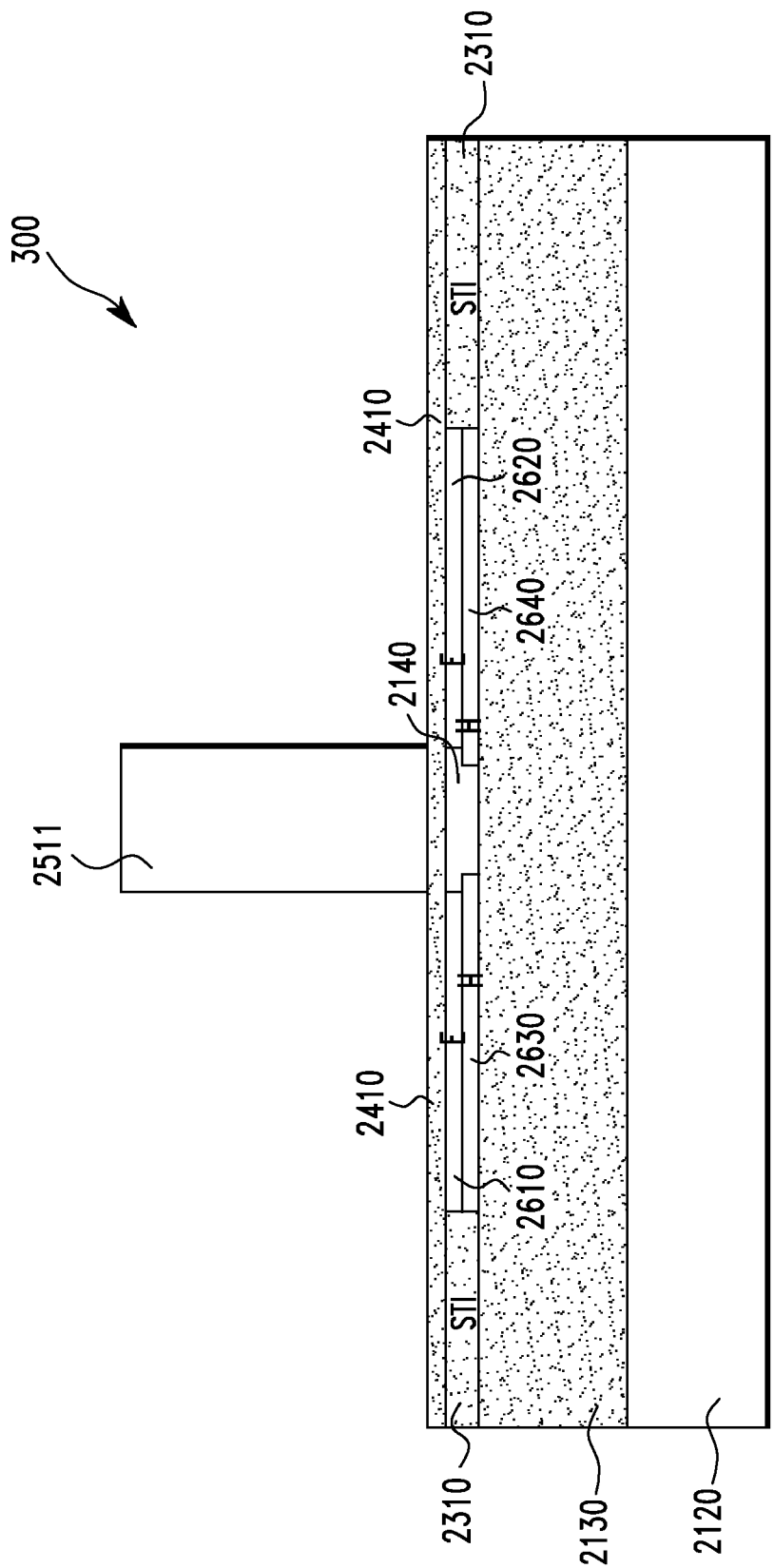

Next, in one embodiment, the polysilicon layer 2510 is selectively etched, resulting in a gate electrode region 2511 as shown in FIG. 26.

Next, with reference to FIG. 26, in one embodiment, extension regions 2610 and 2620 and halo regions 2630 and 2640 are formed in the silicon layer 2140. Illustratively, the extension regions 2610 and 2620 and halo regions 2630 and 2640 are formed by ion implantation using the gate electrode region 2511 as a blocking mask. Hereafter, a silicon region of the silicon layer 2140 which is disposed between the extension regions 2610 and 2620 and the halo regions 2630 and 2640 is referred to as a channel region 2140.

Figure 27:
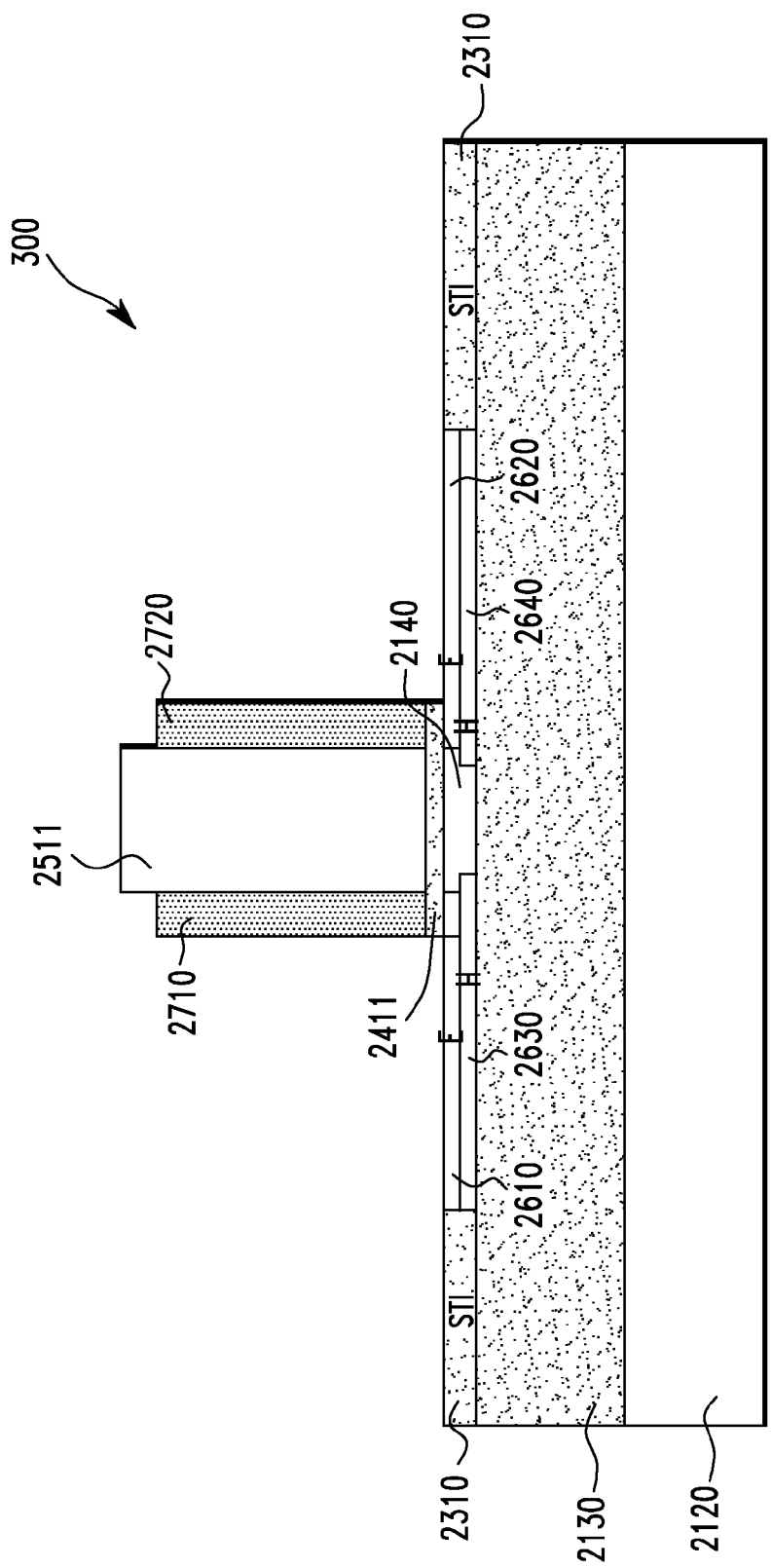

Next, with reference to FIG. 27, in one embodiment, dielectric spacers 2710 and 2720 are formed on side walls of the gate electrode region 2511. Illustratively, the dielectric spacers 2710 and 2720 are formed by (i) CVD of a dielectric layer, such as silicon dioxide or silicon nitride, or a composite of both, everywhere on top of the structure 300 of FIG. 26, and then (ii) directional etching back. Any remaining gate dielectric layer 2410 in the etched-back regions is completely removed by either sufficient over etch, or by and additional etching process, resulting in a gate dielectric region 2411.

Figure 28A:
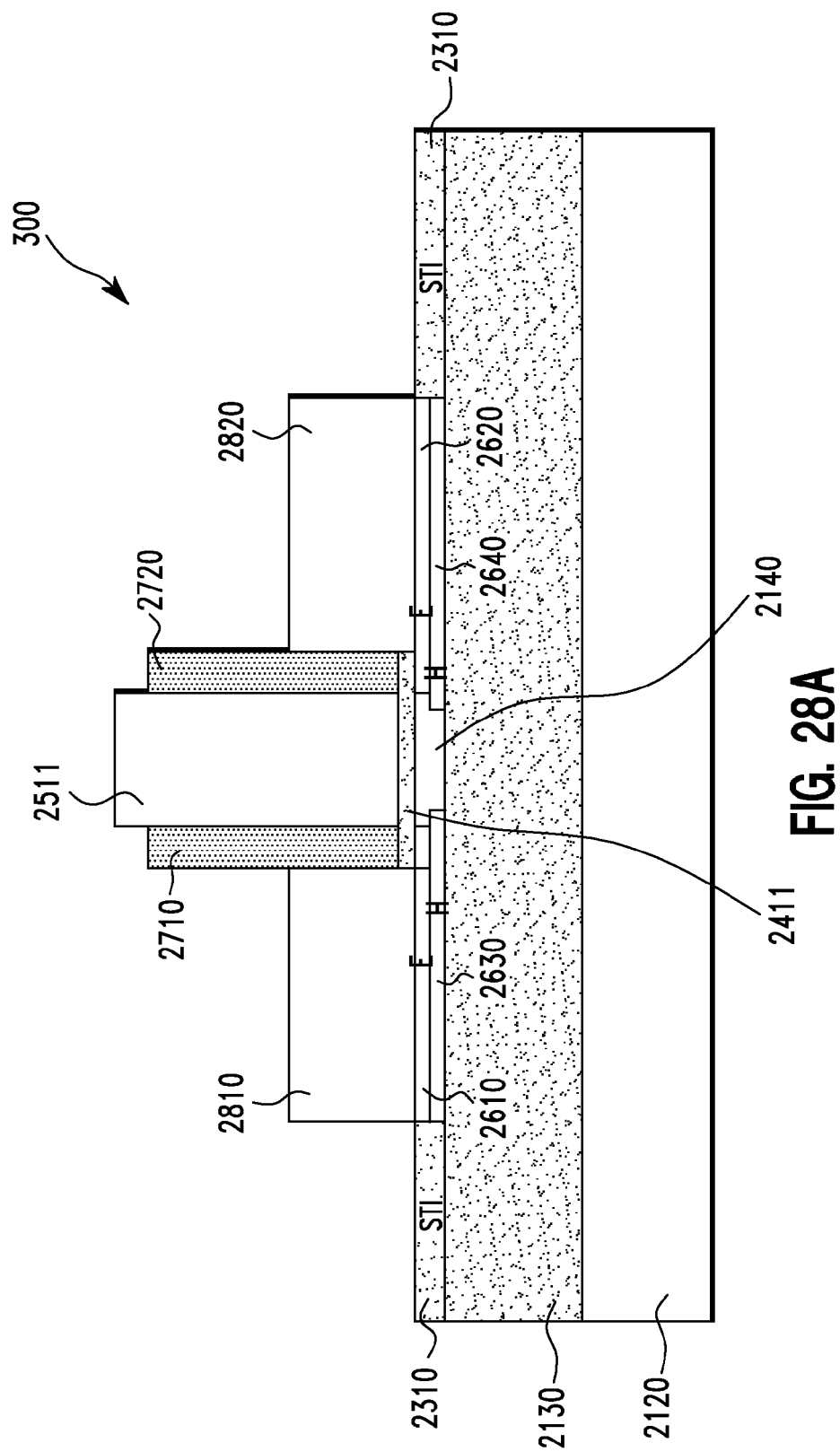

Next, with reference to FIG. 28A, in one embodiment, silicon regions 2810 and 2820 are epitaxially grown on the extension regions 2610 and 2620, respectively.

It should be noted that the silicon is also epitaxially grown on top of the gate electrode region 2511. But to make the description simple, this is not shown. Alternatively, in one embodiment, before the formation of the silicon regions 2810 and 2820 by epitaxial growth, a cap region (not shown) can be formed on top of the gate electrode region 2511. In one embodiment, the cap region (not shown) comprises a silicon dioxide layer and a silicon nitride layer (not shown). More specifically, the silicon dioxide layer and the silicon nitride layer (not shown) can be formed in that order on top of the polysilicon layer 2510 of FIG. 25. After that, the silicon dioxide layer and the silicon nitride layer (not shown) can be patterned at the same time that the gate electrode region 2511 is formed. As a result, portions of the silicon dioxide layer and the silicon nitride layer (not shown) still remain on top of the gate electrode region 2511. Therefore, the cap region (not shown) can prevent epitaxial growth of the silicon on top of the gate electrode region 2511.

Next, in one embodiment, the gate electrode region 2511 and the dielectric spacers 2710 and 2720 are used as a blocking mask to ion implant the silicon regions 2810 and 2820, the extension regions 2610 and 2620 and the halo regions 2630 and 2640 so as to form source/drain regions 2811 and 2821 (as shown in FIG. 28B).

Next, in one embodiment, with reference to FIG. 28B, germanium atoms are implanted in a top portion 2512 of the gate electrode region 2511 by ion implantation in a direction indicated by arrows 2830. Hereafter, the implantation of germanium atoms in the top portion 2512 of the gate electrode region 2511 can be referred to as a germanium implantation step 2830. Illustratively, the germanium implantation step 2830 uses germanium atoms at a high dose ($10^{16}$ Ge atoms/$cm^2$) and at a low energy. As a result of the germanium implantation step 2830, the top portion 2512 expands laterally, as shown in FIG. 29.

Figure 29:
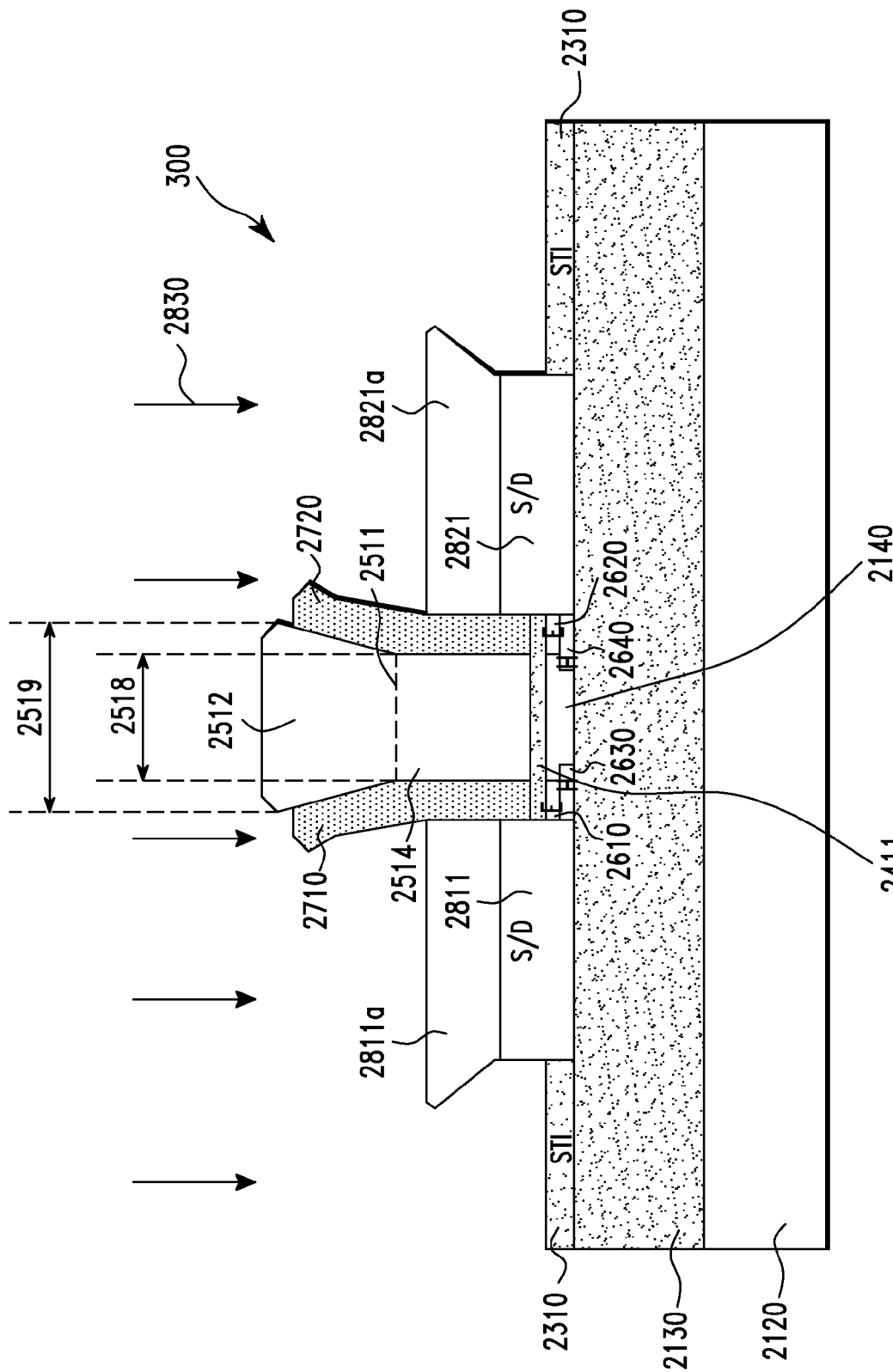

With reference to FIG. 29, it can be seen that as a result of the lateral expansion of the top portion 2512, a width 2519 of the top portion 2512 is greater than a width 2518 of a bottom portion 2514. In one embodiment, the top portion 2512 of the gate electrode region 2511 is expanded laterally at least 20%. In other words, the width 2519 is at least 120% of the width 2518. In one embodiment, the germanium implantation step 2830 also implants Germanium atoms in upper portions 2811a and 2821a of the source/drain regions 2811 and 2821, respectively. As a result, the upper portions 2811a and 2821a are expanded laterally and compressively strained. Therefore, the channel region 2140 is tensile strained.

Figure 30:
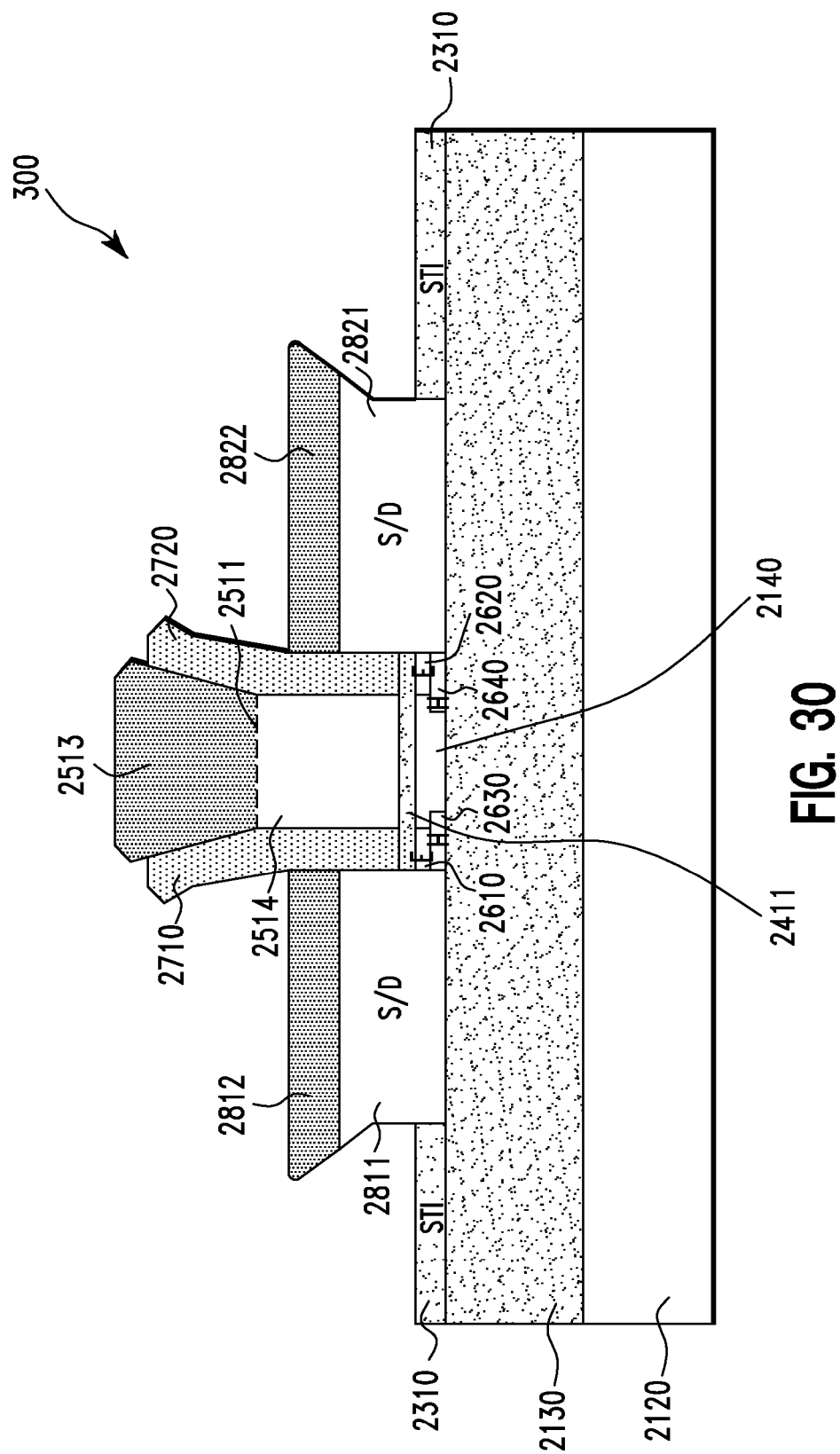

Next, with reference to FIG. 30, in one embodiment, silicide regions 2513, 2812 and 2822 are formed on top of the gate electrode region 2511, the source/drain regions 2811 and 2821, respectively. Illustratively, the silicide regions 2513, 2812, and 2822 comprise silicide nickel. In one embodiment, the silicide regions 2513, 2811 and 2821 are formed by (i) CVD of nickel everywhere on top of the structure 300 (FIG. 29) to form a nickel layer (not shown), then (ii) annealing so that the deposited nickel layer chemically reacts with silicon on top portions of the gate electrode region 2511, the source/drain regions 2811 and 2821 so as to form the silicide regions 2513, 2812 and 2822. Then, unreacted nickel is removed by a wet etching step, resulting in structure 300 of FIG. 30.

In the embodiments described above, germanium ions/atoms are implanted in the gates so as to expand the top portions of the gates. Alternatively, arsenic can be used instead of germanium. Also, in one embodiment, the germanium and arsenic ion implantations can be carried out at room temperature with the ions being at an energy of 25 KeV such that the ions can reach as deep as 23 nm in the gates.

In one embodiment, as a result of the Ge implantation in the top portion 512 (FIG. 9A), the top portion 1321 (FIG. 13B), the top portion 2512 (FIG. 29), and in the top portions 2811a and 2821a (FIG. 29), each of these portions 512, 1321, 2512, 2811a, and 2821a is at least 0.5% compressively strained, meaning the average atom spacing of the resulting Si—Ge lattice is 0.5% less than the average atom spacing of a Si—Ge mixture of the same composition ratio in a relaxed/unstrained condition.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure fabrication method, comprising:
    providing a structure which comprises:
        (a) a substrate which includes a top substrate surface, and a semiconductor region being on the top substrate surface, the semiconductor region including a channel region, a first source/drain region, and a second source/drain region, wherein the channel region is disposed between the first source/drain region and the second source/drain region,
            wherein the top substrate surface defines a reference direction perpendicular to the top substrate surface,
        (b) a gate dielectric region in direct physical contact with the channel region, and
        (c) a gate electrode region including a top portion and a bottom portion,
            wherein the bottom portion is disposed between the top portion and the gate dielectric region,
            wherein the bottom portion is in direct physical contact with the gate dielectric region,
            wherein the gate electrode region is electrically insulated from the channel region by the gate dielectric region, and
            wherein the gate electrode region is formed by (i) providing a gate electrode layer; and (ii) patterning the gate electrode layer resulting in the gate electrode region; and
    after said providing the structure is performed, implanting atoms in the top portion of the gate electrode region resulting in the top portion of the gate electrode region being expanded in a lateral direction perpendicular to the reference direction, wherein said implanted atoms comprise germanium atoms;
    after said implanting the atoms is performed, forming a conformal dielectric layer on top and side walls of the gate electrode region;
    after said forming the conformal dielectric layer is performed, forming a dielectric spacer layer on the conformal dielectric layer; and
    after said forming the dielectric spacer layer is performed, etching the dielectric spacer layer such that only spacer portions of the dielectric spacer layer which are under the conformal dielectric layer remain, wherein for any point of the remaining spacer portions, a straight line going through that point and being parallel to the reference direction intersects the conformal dielectric layer.

2. The method of claim 1, wherein said implanting the atoms is performed at an energy of about 25 KeV.

3. The method of claim 1, wherein said implanting the atoms is performed at about room temperature.

4. The method of claim 1,
    wherein the structure further comprises a substrate,
    wherein the substrate is in direct physical contact with the semiconductor region via a first interfacing surface that defines a normal direction perpendicular to the first interfacing surface, and
    wherein said implanting the atoms is performed in a direction making with the normal direction an angle less than 10 degrees.

5. The method of claim 1, wherein the first width of the top portion and the second of the bottom portion are about the same before said implanting is performed.

6. The method of claim 1, further comprising, after said implanting the atoms is performed, forming silicide regions in the top portion of the gate electrode region and on the first source/drain region and the second source/drain region.

7. The method of claim 6,
    wherein the top portion of the gate electrode region and the first and second source/drain regions comprise silicon, and
    wherein said forming the suicide regions comprises:
        depositing nickel on top of the structure; and
        annealing the structure so that the nickel chemically reacts with the silicon of the top portion of the gate electrode region and the first and second source/drain regions to form the silicide regions.

8. The method of claim 1, wherein the structure further comprises a first extension region, a second extension region, a first halo region, and a second halo region,
    wherein the first extension region is in direct physical contact with the channel region and the first source/drain region,
    wherein the second extension region is in direct physical contact with the channel region and the second source/drain region, wherein the first halo region is in direct physical contacts with the channel region, the first source/drain region and the first extension region, and wherein the second halo region is in direct physical contacts with the channel region, the second source/drain region and the second extension region.

9. The method of claim 8, wherein the first and second source/drain regions, the first and second extension regions, and the first and second halo regions are formed by ion implantation.

10. The method of claim 1, wherein the atoms are germanium atoms, and wherein a first width of the top portion is at least 20% greater than a second width of the bottom portion.

11. The method of claim 10, wherein said implanting the atoms is performed at a dose of $10^{16}$ germanium atoms/cm$^2$.

12. The method of claim 10, further comprising implanting other atoms in the first and second source/drain regions to expand first and second upper portions of the first and second source/drain regions, respectively, wherein said implanting the atoms and said implanting the other atoms are performed simultaneously.

13. The method of claim 10, wherein the top portion of the gate electrode region comprises germanium and polysilicon.

14. A semiconductor structure fabrication method, comprising:

providing a structure which comprises:

(a) a substrate which includes a top substrate surface, and a semiconductor region being on the top substrate surface, the semiconductor region including a first portion, a second portion, and a channel region, wherein the channel region is disposed between the first and second portions, wherein the top substrate surface defines a reference direction perpendicular to the top substrate surface, (b) a gate dielectric region in direct physical contact with the channel region, and (c) a gate electrode region including a top portion and a bottom portion, wherein the bottom portion is in direct physical contact with the gate dielectric region, wherein the gate electrode region is electrically insulated from the channel region by the gate dielectric region, and wherein the gate electrode region is formed by (i) providing a gate electrode layer; and (ii) patterning the gate electrode layer resulting in the gate electrode region; and after said providing the structure is performed, implanting atoms in the top portion of the gate electrode region so as to expand the top portion of the gate electrode region in a lateral direction perpendicular to the reference direction, wherein said implanted atoms comprise germanium atoms;

after said implanting the atoms is performed, forming a conformal dielectric layer on top and side walls of the gate electrode region;

after said forming the conformal dielectric layer is performed, forming a dielectric spacer layer on the conformal dielectric layer; and after said forming the dielectric spacer layer is performed, etching the dielectric spacer layer such that only spacer portions of the dielectric spacer layer which are under the conformal dielectric layer remain, wherein for any point of the remaining spacer portions, a straight line going through that point and being parallel to the reference direction intersects the conformal dielectric layer.

15. The method of claim 14, wherein a first width of the top portion is at least 20% greater than a second width of the bottom portion.

16. The method of claim 14, further comprising doping the first and second portion so as to form a first source/drain region and a second source/drain region, respectively.

* * * * *